(12) United States Patent
Son et al.

(10) Patent No.: US 10,741,614 B2
(45) Date of Patent: Aug. 11, 2020

(54) DISPLAY DEVICE HAVING A SLOPED INSULATING LAYER SUPPORTING AN OLED ARRAY AS USED IN EYEGLASSES-LIKE AUGMENTED REALITY DEVICE

(71) Applicant: LG Display Co., Ltd., Seoul (KR)

(72) Inventors: Younghoon Son, Paju-si (KR); Yeonsuk Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/200,316

(22) Filed: Nov. 26, 2018

(65) Prior Publication Data

US 2019/0165052 A1 May 30, 2019

(30) Foreign Application Priority Data

Nov. 30, 2017 (KR) ........................ 10-2017-0162520

(51) Int. Cl.
*H01L 27/32* (2006.01)
*G02B 27/01* (2006.01)
*H01L 51/52* (2006.01)

(52) U.S. Cl.
CPC ...... *H01L 27/3211* (2013.01); *G02B 27/0172* (2013.01); *H01L 27/322* (2013.01); *H01L 27/3244* (2013.01); *H01L 27/3258* (2013.01); *H01L 51/5262* (2013.01); *G02B 2027/0178* (2013.01)

(58) Field of Classification Search
CPC ............. H01L 27/3211; H01L 27/3258; H01L 27/322; H01L 27/28; H01L 51/5262
See application file for complete search history.

(56) References Cited

U.S. PATENT DOCUMENTS

| 10,290,832 B2* | 5/2019 | Ueda ................ H01L 51/5228 |
| 2014/0301062 A1* | 10/2014 | David .................... F21V 9/30 362/84 |
| 2015/0001477 A1* | 1/2015 | Namkung ......... H01L 27/3258 257/40 |
| 2017/0154930 A1 | 6/2017 | Kim et al. |
| 2019/0066546 A1 | 2/2019 | Kato et al. |

FOREIGN PATENT DOCUMENTS

| JP | 2010-56016 A | 3/2010 |
| JP | 2014-526068 A | 10/2014 |
| KR | 10-2007-0052914 A | 5/2007 |
| KR | 10-2009-0003590 A | 1/2009 |
| KR | 10-2011-0058707 A | 6/2011 |
| KR | 10-2013-0000401 A | 1/2013 |
| KR | 10-2015-0003572 A | 1/2015 |
| KR | 10-2015-0086497 A | 7/2015 |
| KR | 10-2015-0096547 A | 8/2015 |
| KR | 10-2017-0062904 A | 6/2017 |
| WO | 2017/169961 A1 | 10/2017 |

* cited by examiner

*Primary Examiner* — Quoc D Hoang
(74) *Attorney, Agent, or Firm* — Seed IP Law Group LLP

(57) ABSTRACT

A display device and an eyeglasses-like augmented reality device using the same are provided. The display device includes a display panel including a lower substrate and an upper substrate and having a display area, an insulating layer that lies over the lower substrate and has a sloped surface in the display area, and an organic light-emitting diode on the insulating layer. The insulating layer has different slopes for different positions in the display area.

18 Claims, 19 Drawing Sheets

------- Normalized Intensity
— — — 16~36 degree

[Brightness variation with viewing angle of microcavity OLED device]

[Brightness variation with viewing angle of microcavity OLED device]

DISPLAY DEVICE HAVING A SLOPED INSULATING LAYER SUPPORTING AN OLED ARRAY AS USED IN EYEGLASSES-LIKE AUGMENTED REALITY DEVICE

CROSS-REFERENCE TO RELATED APPLICATION

This application claims the benefit of Korean Patent Application No. 10-2017-0162520, filed on Nov. 30, 2017, which is incorporated herein by reference for all purposes as if fully set forth herein.

BACKGROUND

Technical Field

The present disclosure relates to a display device and an eyeglasses-like augmented reality device using the same.

Description of the Related Art

The market for displays which act as an intermediary between users and information is growing with the development of information technology. Thus, display devices such as liquid crystal displays (LCD), field emission displays (FED), light-emitting displays (LED), and electrophoresis displays (EPD) are increasingly used.

A light-emitting display device is based on light-emitting display elements. The light-emitting display device comprises a display panel comprising a plurality of subpixels, a drive part that drives the display panel, and a power supply part that supplies electric power to the display panel. The drive part comprises a scan driver that supplies scan signals (or gate signals) to the display panel and a data driver that supplies data signals to the display panel.

The light-emitting display device can emit light itself and therefore may be implemented as a television, a video player, a personal computer (PC), a home theater, a smartphone, a virtual reality (VR) device, an augmented reality (AR) device, etc. To make the light-emitting display device suitable for at least one of the above devices, there is a need for research into a structure for minimizing the loss of brightness on the display panel, that will work well with the intended device.

BRIEF SUMMARY

An exemplary embodiment of the present disclosure provides a display device comprising: a display panel comprising a lower substrate and an upper substrate and having a display area; an insulating layer that lies over the lower substrate and has a sloped surface in the display area; and an organic light-emitting diode on the insulating layer, wherein the insulating layer has different slopes for different positions in the display area.

Another exemplary embodiment of the present disclosure provides a display device comprising: a display panel comprising a lower substrate, an upper substrate, and a plurality of subpixels located between the lower and upper substrates; and a color filter layer overlying the upper substrate, each color filter of which is positioned to correspond to part of a first subpixel and part of a second subpixel, wherein the display panel comprises: an insulating layer on the lower substrate; and organic light-emitting diodes that lie on the insulating layer and are positioned to correspond to the plurality of subpixels, wherein the insulating layer has a sloped surface in some parts of a display area of the display panel.

Still another exemplary embodiment of the present disclosure provides an eyeglasses-like augmented reality device comprising: a display panel that displays an image; an optical lens that is placed on the front of the display; and a housing that contains the display panel and the optical lens, wherein the display panel comprises: an insulating layer on the lower substrate; and organic light-emitting diodes that lie on the insulating layer and are positioned to correspond to the plurality of subpixels, wherein the insulating layer has a sloped surface in some parts of a display area of the display panel.

BRIEF DESCRIPTION OF THE SEVERAL VIEWS OF THE DRAWINGS

The accompany drawings, which are included to provide a further understanding of the disclosure and are incorporated on and constitute a part of this specification, illustrate embodiments of the disclosure and together with the description serve to explain the principles of the disclosure.

DETAILED DESCRIPTION

Reference will now be made in detail embodiments of the disclosure examples of which are illustrated in the accompanying drawings.

Hereinafter, concrete embodiments of the present disclosure will be described with reference to the accompanying drawings.

A display device to be described below is applicable to any self-emissive display device that is based on self-emitting elements that can emit light themselves. Particularly, the display device to be described below is applicable to an inorganic light-emitting display device that is based on inorganic light-emitting diodes, as well as an organic light-emitting display device that is based on organic light-emitting diodes (light-emitting display elements). However, the following description will be given with respect to an organic light-emitting display device.

Figure 1:
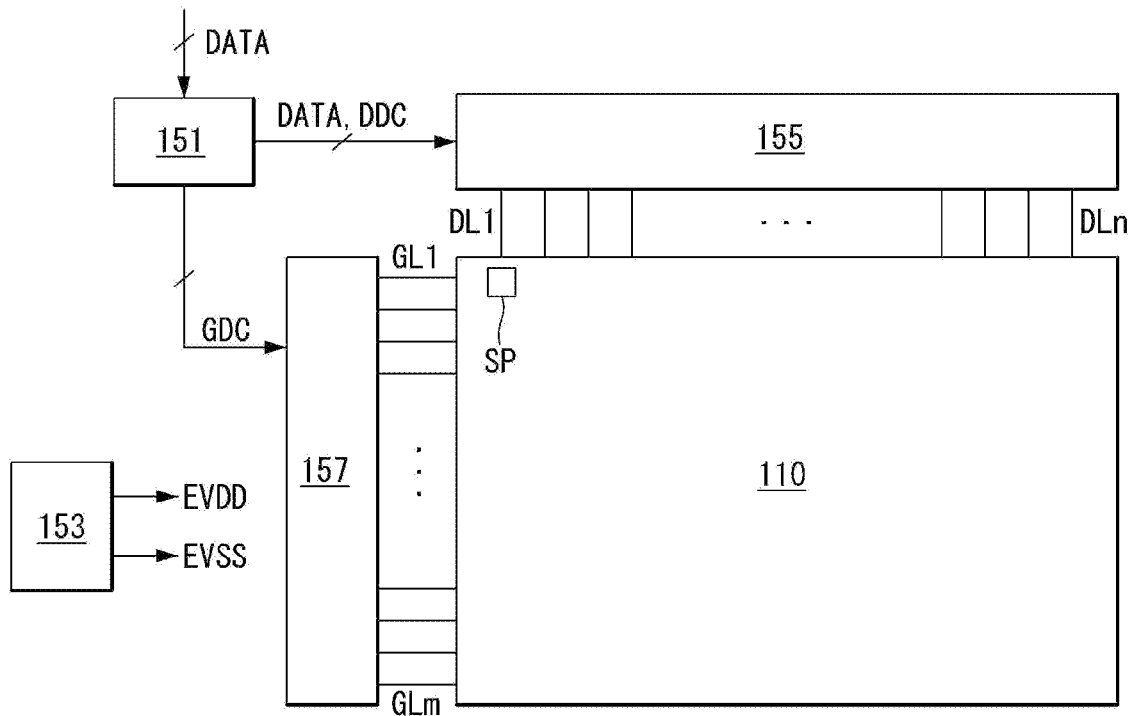
FIG. 1 is a schematic block diagram of an organic light-emitting display.
Figure 2:
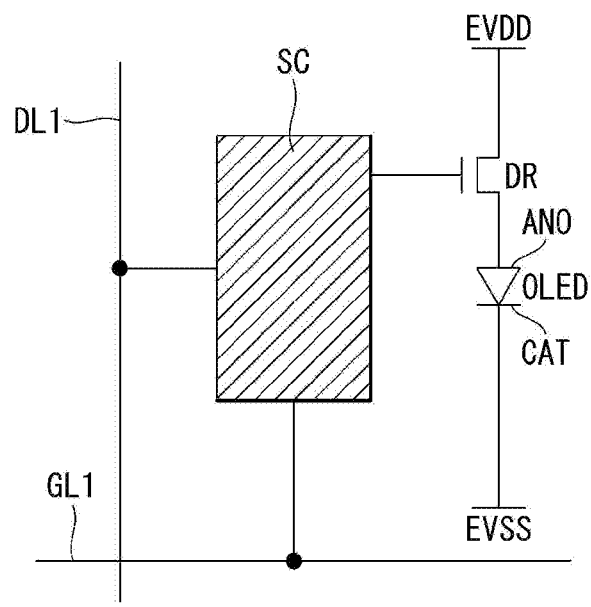
FIG. 2 is a schematic circuit diagram of a subpixel.
Figure 3A:
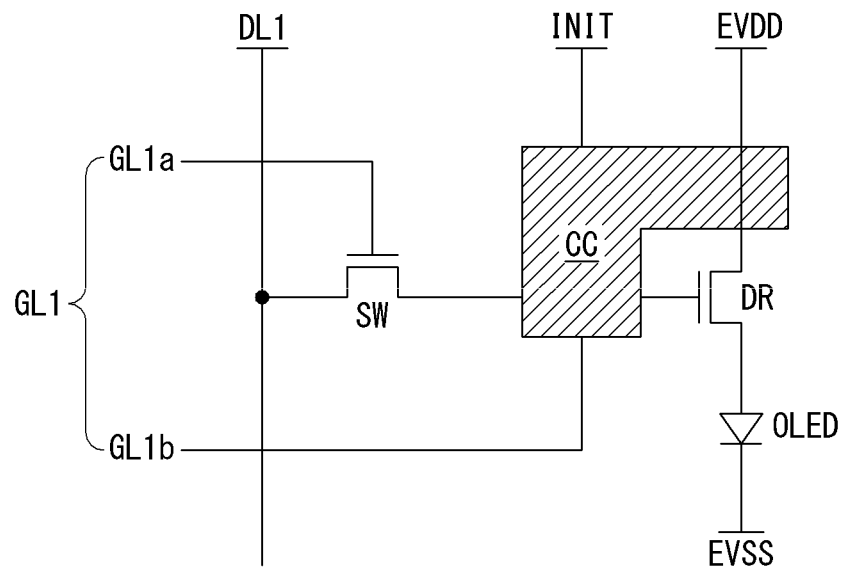
FIGS. 3A and 3B are a detailed circuit diagrams illustrating a portion of FIG. 2.
Figure 3B:
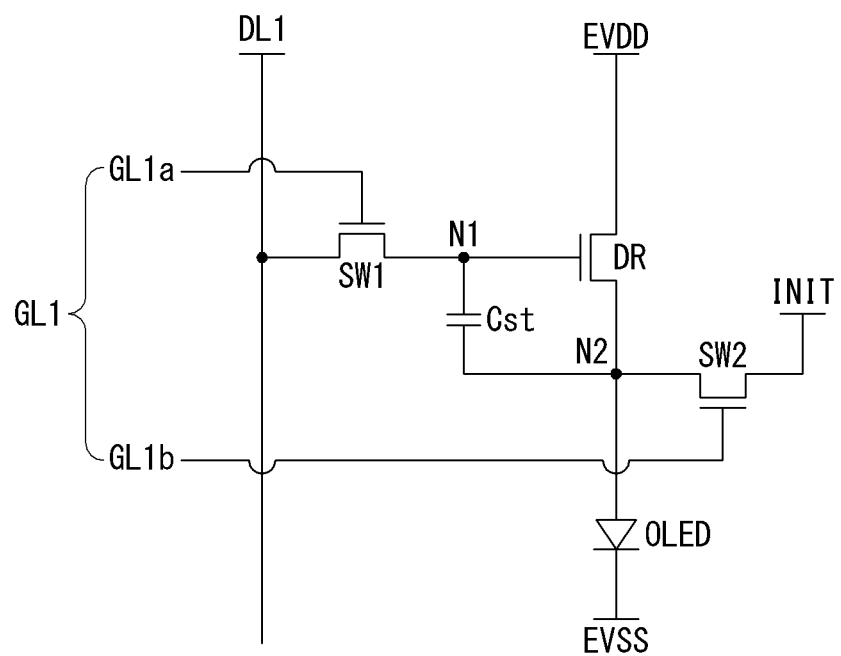
Figure 4:
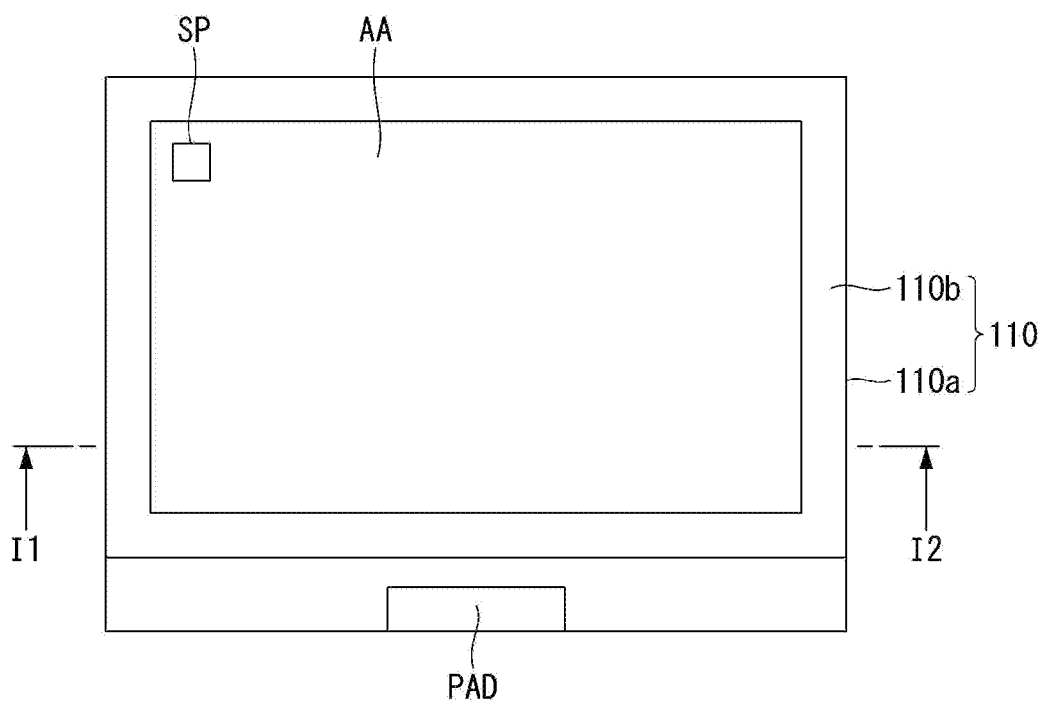
FIG. 4 is a view illustrating the plane of a display panel.
Figure 5A:
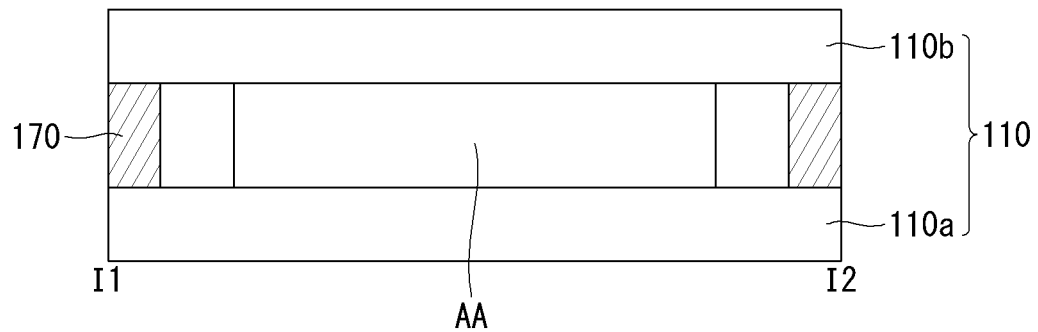
FIGS. 5A and 5B is a cross-sectional view taken along the line I1-I2 of FIG. 4 of different embodiments.
Figure 5B:
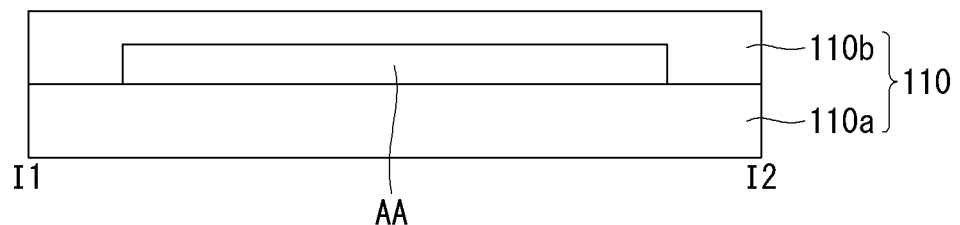

FIG. 1 is a schematic block diagram of an organic light-emitting display. FIG. 2 is a schematic circuit diagram of a subpixel. FIGS. 3A and 3B are detailed circuit diagrams illustrating a portion of FIG. 2. FIG. 4 is a view illustrating the plane of a display panel. FIGS. 5A and 5B are cross-sectional views of different embodiments taken along the line I1-I2 of FIG. 4

As shown in FIG. 1, the organic light-emitting display comprises a timing controller 151, a data driver 155, a scan driver 157, a display panel 110, and a power supply part 153.

The timing controller 151 receives drive signals, including a data enable signal, a vertical synchronization signal, a horizontal synchronization signal, and a clock signal, along with data signals DATA, from an image processor (not shown). Based on the drive signals, the timing controller 151 outputs a gate timing control signal GDC for controlling the operation timing of the scan driver 157 and a data timing control signal DDC for controlling the operation timing of the data driver 155. The timing controller 151 may be provided in the form of an IC (integrated circuit)

The data driver 155 samples and latches a data signal DATA supplied from the timing controller 151 in response to a data timing control signal DDC supplied from the timing controller 151, and converts a digital data signal to an analog data signal (or data voltage) as a gamma reference voltage and outputs it. The data driver 155 outputs data signals DATA through data lines DL1 to DLn. The data driver 155 may be provided in the form of an IC (integrated circuit).

The scan driver 157 outputs scan signals in response to a gate timing control signal GDC supplied from the timing controller 151. The scan driver 157 outputs scan signals through scan lines GL1 to GLm. The scan driver 157 may be provided in the form of an IC or formed on the display panel 110 using the gate-in-panel technology (in which transistors are formed using a thin-film process).

The power supply part 153 outputs a high-level voltage and a low-level voltage. The high-level voltage and low-level voltage outputted from the power supply part 153 are supplied to the display panel 110. The high-level voltage is supplied to the display panel 110 via a first power line EVDD, and the low-level voltage is supplied to the display panel 110 via a second power line EVSS. The power supply part 153 may be provided in the form of an IC.

The display panel 110 displays an image in response to data signals DATA supplied from the data driver 155, scan signals supplied from the scan driver 157, and electric power supplied from the power supply part 153. The display panel 110 comprises subpixels SP that work to display an image and emit light.

The subpixels SP may comprise red subpixels, green subpixels, and blue subpixels, or may comprise white subpixels, red subpixels, green subpixels, and blue subpixels. The subpixels SP may have one or more different light-emission areas depending on the light-emission characteristics.

As shown in FIG. 2, a single subpixel is positioned at the intersection of a data line DL1 and a scan line GL1, and comprises a programming part SC for setting the gate-source voltage of a driving transistor DR and an organic light-emitting diode OLED.

The organic light-emitting diode OLED comprises an anode ANO, a cathode CAT, and an organic emissive layer sandwiched between the anode ANO and cathode CAT. The anode ANO is connected to the driving transistor DR.

The programming part SC may comprise a transistor part (transistor array) comprising at least one switching transistor and at least one capacitor. The transistor part is implemented based on CMOS semiconductor, PMOS semiconductor, or NMOS semiconductor. The transistors included in the transistor part may be implemented as p-type or n-type. Moreover, semiconductor layers of the transistors included in the transistor part of the subpixel may contain amorphous silicon, polysilicon, or oxide.

The switching transistor turns on in response to a scan signal from the scan line GL1 to apply a data voltage from the data line DL1 to one electrode of the capacitor. The driving transistor DR adjusts the amount of light emitted from the organic light-emitting diode OLED by controlling the amount of current depending on the amount of voltage stored in the capacitor. The amount of light emitted from the organic light-emitting diode OLED is proportional to the amount of current supplied from the driving transistor DR. Also, the subpixel is connected to a first power supply line EVDD and a second power supply line EVSS to receive high-level voltage and low-level voltage.

As shown in FIG. 3A, the subpixel may comprise an internal compensation circuit CC, as well as the aforementioned switching transistor SW, driving transistor DR, capacitor Cst, and organic light-emitting diode OLED. The internal compensation circuit CC may comprise one or more transistors connected to a compensation signal line INIT. The internal compensation circuit CC sets the gate-source voltage of the driving transistor DR to a voltage that reflects variation in threshold voltage, so as to cancel out any brightness variation caused by the threshold voltage of the driving transistor DR when the organic light-emitting diode OLED emits light. In this case, the scan line GL1 comprises at least two scan lines GL1a and GL1b for controlling the switching transistor SW and the transistors in the internal compensation circuit CC.

As shown in FIG. 3B, the subpixel may comprise a switching transistor SW1, a driving transistor DR, a sensing transistor SW2, a capacitor Cst, and an organic light-emitting diode OLED. The sensing transistor SW2 is a transistor that may be included in the internal compensation circuit CC, and performs a sensing operation for compensating for the subpixel.

The switching transistor SW1 serves to supply a data voltage supplied through the data line DL1 to a first node N1, in response to a scan signal supplied through the first scan line GL1a. The sensing transistor SW2 serves to reset or sense a second node N2 situated between the driving transistor DR and the organic light-emitting diode OLED, in response to a sensing signal supplied through the second scan line GL1b.

Meanwhile, the above circuit configuration of the subpixel depicted in FIGS. 3A and 3B are provided only for ease of comprehension. That is, the circuit configuration of the subpixel according to the present disclosure is not limited to the above, but may vary, including 2T(transistor)1C(capacitor), 3T2C, 4T2C, 5T1C, 6T2C, and 7T2C.

As shown in FIG. 4, the display panel 110 comprises a lower substrate 110a, an upper substrate 110b, a display area AA, and a pad part PAD. The display area AA is made up of subpixels SP that emit light. While the subpixels SP in the display area AA are sealed because of their sensitivity to moisture or oxygen, the pad part PAD is exposed because it is made up of pads for facilitating an electrical connection with an external substrate.

The display area AA may be placed to take up most of the surface of the lower substrate 110a, and the pad part PAD may be placed on one outer edge of the lower substrate 110a. The display panel 110 may be rectangular, for example, and also may have various shapes like a pentagon, hexagon, polygon, circle, or ellipse.

As shown in FIG. 4 and FIG. 5A, the display area AA may be sealed with a sealing member 170 situated between the lower substrate 110a and upper substrate 110b. As shown in FIG. 4 and FIG. 5B, the display area AA may be sealed by the lower substrate 110a and upper substrate 110b alone.

The display panel 110 may come in various shapes, including flat, flexible or stretchable, or curved. Moreover, the display panel 110 may be implemented as a bottom-emission type that emits light toward the lower substrate 110a, a top-emission type that emits light toward the upper substrate 110b, or a dual-emission type that emits light toward both of the substrates 110a and 110b. Therefore, the sealing structure of the display panel 110 may be selected to conform to a desired shape and is therefore not limited to what is depicted in FIGS. 4 and 5A and 5B.

The above-explained light-emitting display device to be described below may be implemented as a television, a video player, a personal computer (PC), a home theater, a smartphone, a virtual reality (VR) device, an augmented reality (AR) device, etc. However, the present disclosure will be described below with respect to an eyeglasses-like augmented reality device since it offers better benefits when implemented as an augmented reality device.

Figure 6:
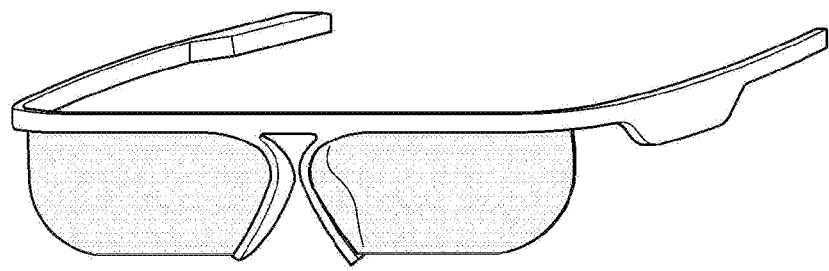
FIG. 6 is a view of an eyeglasses-like augmented reality device.
Figure 7:
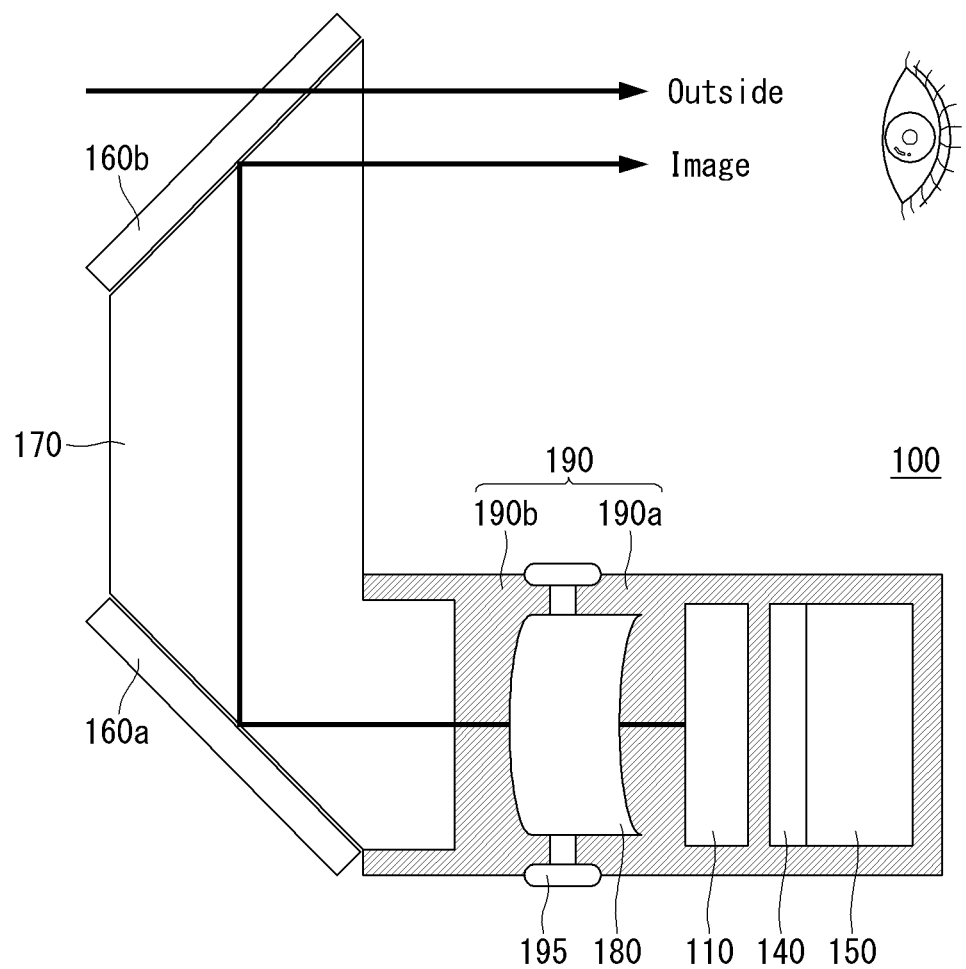
FIG. 7 is a view of the basic configuration of an eyeglasses-like augmented reality device.
Figure 8:
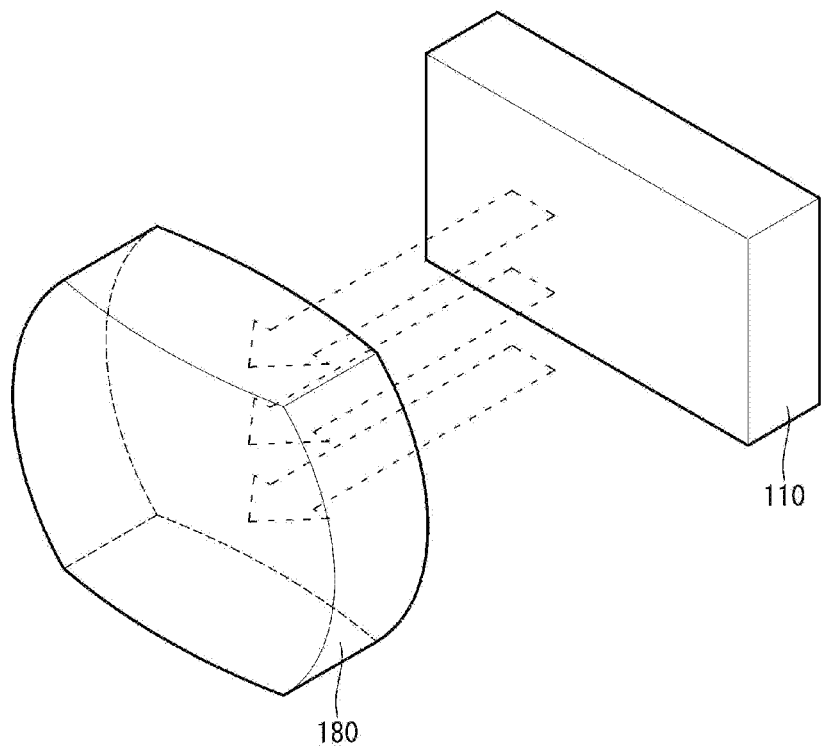
FIG. 8 is a first exemplary view of an optical lens and display panel of an eyeglasses-like augmented reality device.
Figure 9A:
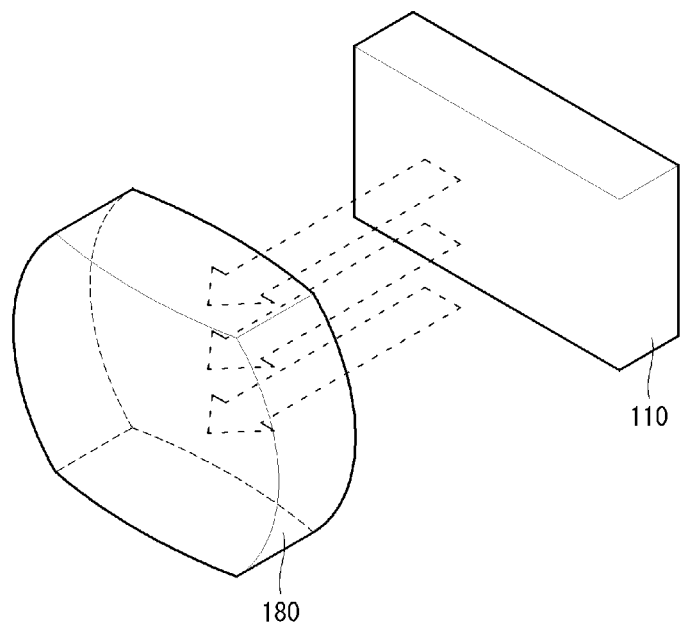
FIGS. 9A and 9B are second exemplary views of an optical lens and display panel of an eyeglasses-like augmented reality device.
Figure 9B:
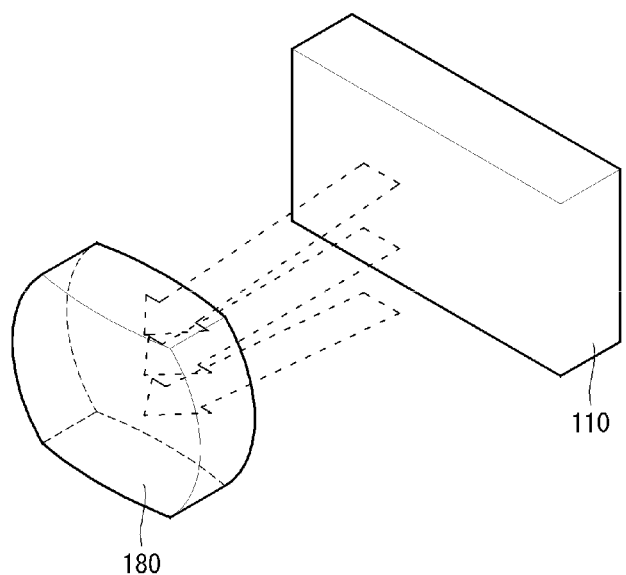
Figure 10:
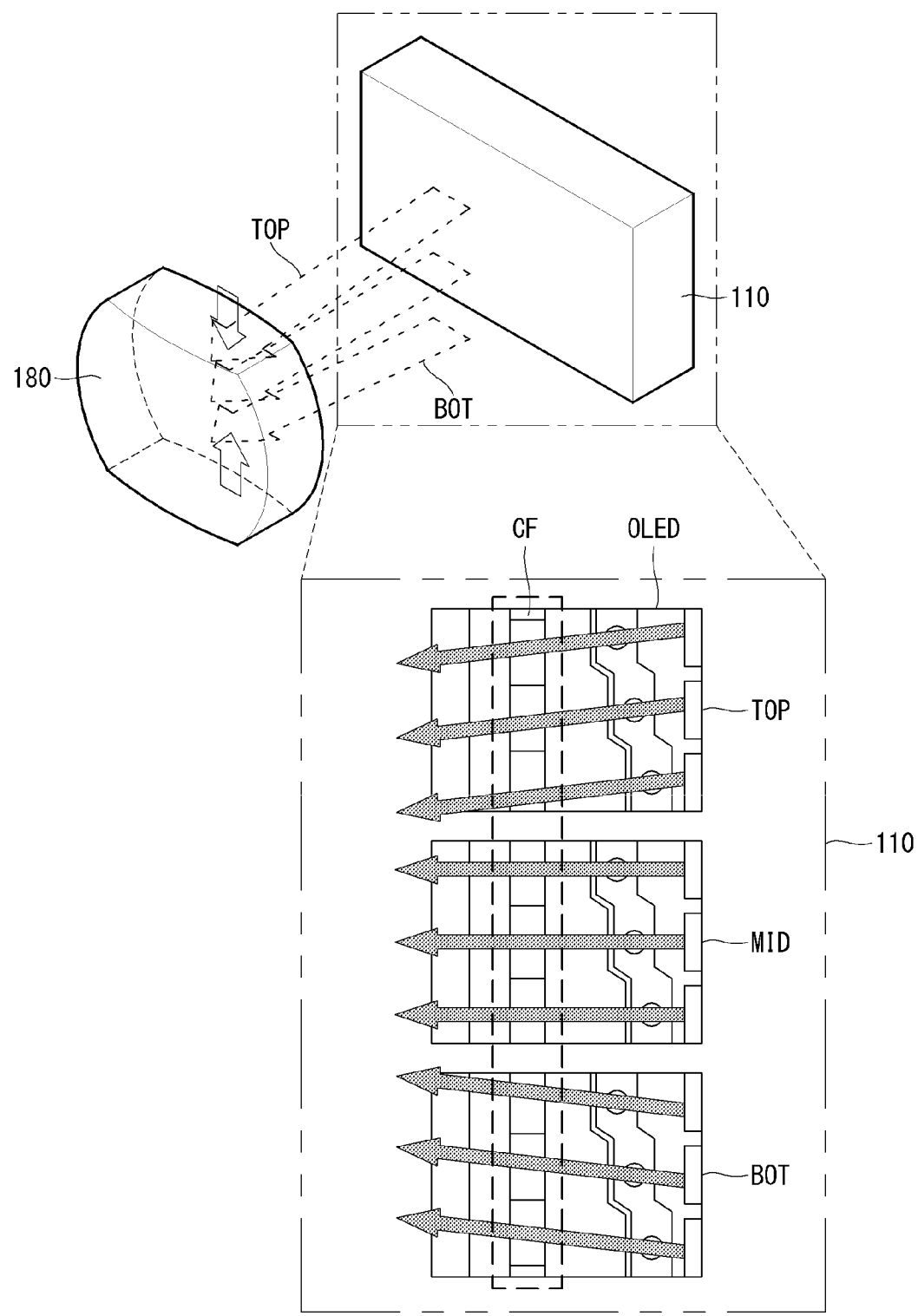
FIG. 10 is a third exemplary view for assisting in structural understanding of the miniaturization of an optical lens.

FIG. 6 is a view of an eyeglasses-like augmented reality device 100. FIG. 7 is a view of the basic configuration of an eyeglasses-like augmented reality device 100. FIG. 8 is a first exemplary view of an optical lens and display panel of an eyeglasses-like augmented reality device. FIGS. 9A and 9B are second and third exemplary views of an optical lens and display panel of an eyeglasses-like augmented reality device 100. FIG. 10 is a fourth exemplary view for assisting in structural understanding of the miniaturization of an optical lens.

As shown in FIGS. 6 to 8, an eyeglasses-like augmented reality device 100 comprises a display panel 110, a flexible circuit board 140, a printed circuit board 150, a first mirror 160a, a second mirror 160b, a light guide 170, an optical lens 180, a fastening part 195, and a housing 190.

The housing 190 serves to contain the components of the eyeglasses-like augmented reality device 100—for example, the display panel 110, the flexible circuit board 140, and the printed circuit board 150. The housing 190 may comprise a first housing 190a and a second housing 190b. The first housing 190a and the second housing 190b may be physically held together by the fastening part 195. The housing 190 can be coupled to the augmented reality device 100.

The display panel 110 and the printed circuit board 150 are electrically connected by the flexible circuit board 140. The scan driver, etc., may be placed in the form of a gate-in-panel on the display panel 110. The data driver, etc., may be placed in the form of an IC on the printed circuit board 150. The timing controller, power supply part, etc., may be placed in the form of an IC on the printed circuit board 150.

The optical lens 180 is placed on the front of the display area of the display panel 110. The optical lens 180 may be a lens that has a wider angle of view on the display panel 110 and a short focal length. For example, the optical lens 180 may be a convex lens whose light-emitting surface is convex. The optical lens 180 may be placed between the first housing 190a and the second housing 190b.

The first mirror 160a is placed on the front of the optical lens 180. The first mirror 160a serves to horizontally reflect an image, which is light, that leaves the optical lens 180 and vertically hits the first mirror 160a. The first mirror 160a serves to change the light path from vertical to horizontal. To this end, the first mirror 160a may have a first slope.

The light guide 170 is placed between the first mirror 160a and the second mirror 160b. One side of the light guide 170 adjoins the first mirror 160a, and the other side adjoins the second mirror 160b. The light guide 170 serves to guide the image, which is light, reflected from the first mirror 160a to the second mirror 160b.

The second mirror 160b is placed on the other side of the light guide 170. The second mirror 160b serves to vertically reflect an image, which is light, that passes through the light guide 170 and then horizontally hits the second mirror 160b. The second mirror 160b serves to change the light path from horizontal to vertical. To this end, the first mirror 160a may have a second slope which is in symmetry with the first slope. The second mirror 160b may be, but not limited to, a half mirror through which an outside environment or objects, as well as an image displayed on the display panel 110, can be viewed.

As shown in FIG. 9A, in the eyeglasses-like augmented reality device, the display panel 110 and the optical lens 180 may be almost similar in size. The present disclosure permits use of an optical lens 180 smaller in size than the display panel 110, as shown in of FIG. 9B.

As shown in FIG. 9B, if the optical lens 180 is made smaller in size than the display panel 110, the eyeglasses-like augmented reality device can be smaller and more lightweight. One advantage of this is that some changes can be made, such as giving more comfort to the user or increasing battery capacity.

As shown in FIG. 10, the display panel 110 used in the eyeglasses-like augmented reality device may be implemented based on, for example, organic light-emitting diodes OLEDs that emit white light and a color filter layer CF that filters white light into red, green, or blue. However, the display panel 110 used in the eyeglasses-like augmented reality device should be regarded as merely an example because it may come in different configurations.

The present disclosure is generally directed to the concept of focusing an image, which is light, from a top display area TOP and bottom display area BOT of the display panel 110 to a middle display area MID, as a way of miniaturizing the optical lens 180 used in the eyeglasses-like augmented reality device. The sizes of the top display area TOP and bottom display area BOT of the display panel 110 may vary depending on how much the optical lens 180 is miniaturized—that is, how much the optical lens 180 is reduced in size. Therefore, it should be noted that the sizes and dimensions of the top display area TOP and bottom display area BOT of the display panel 110 need not be specified since the present teachings can be used with many different sizes and dimensions of AR or VR devices According to the results of the experimental example, further steps can be taken to reduce the luminance loss in order to make the optical lens 180 smaller and lighter, which additional steps are described herein as part of this disclosure.

Test Example

Figure 11:
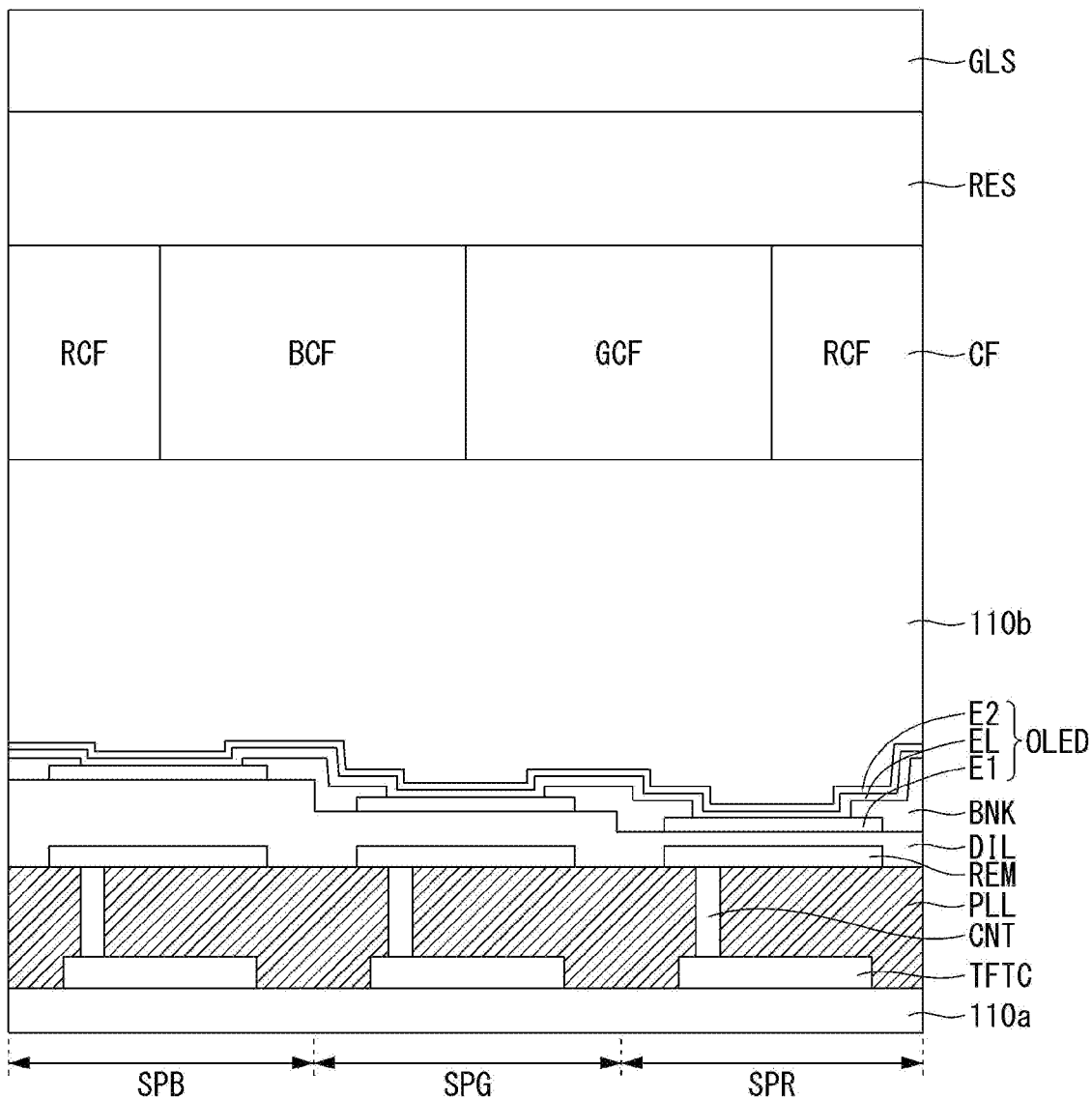
FIGS. 11 and 12 are cross-sectional views showing primary components of a display panel in an eyeglasses-like augmented reality device according to a test example and the directions in which they emit light.
Figure 12:
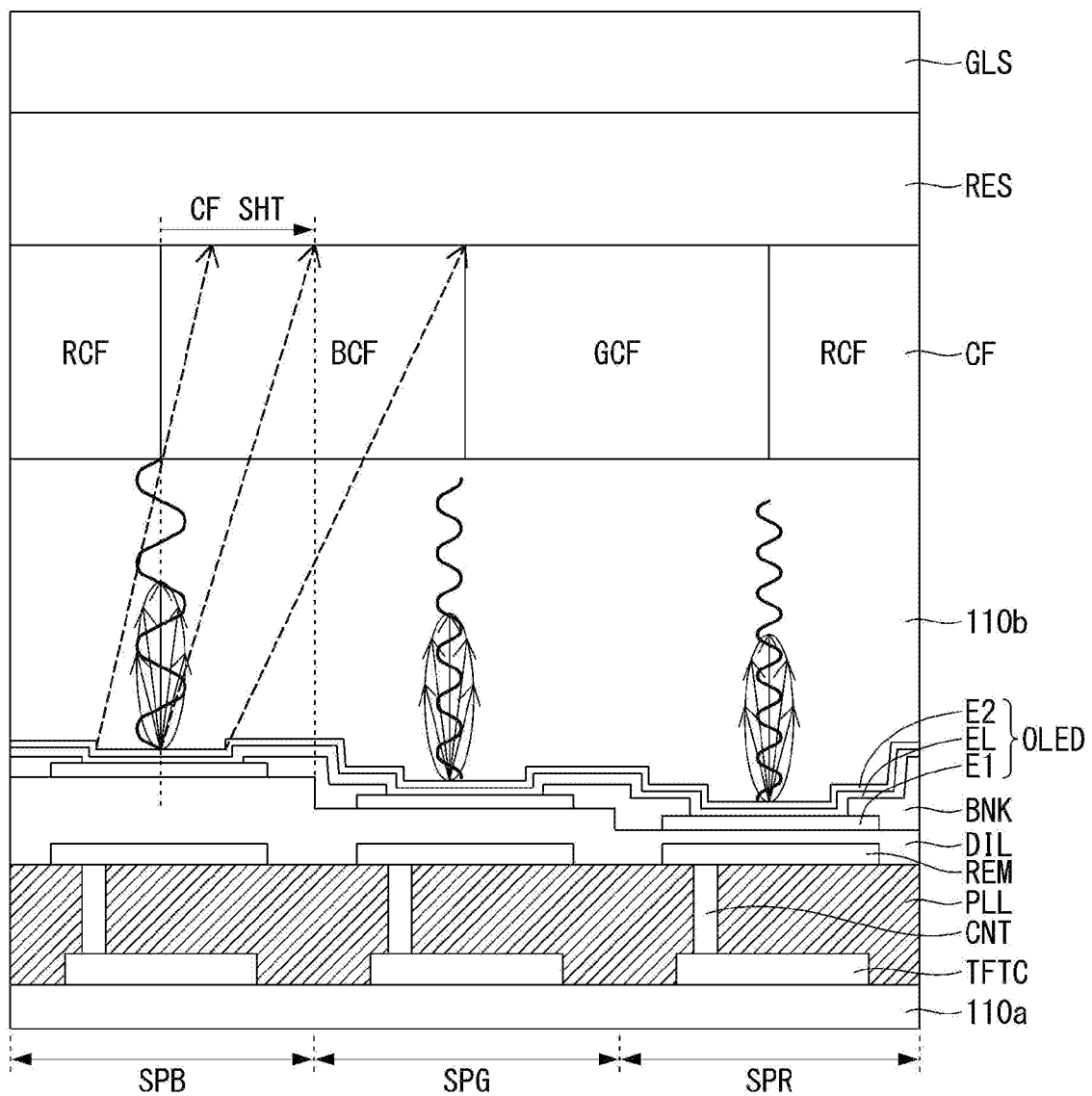
Figure 13:
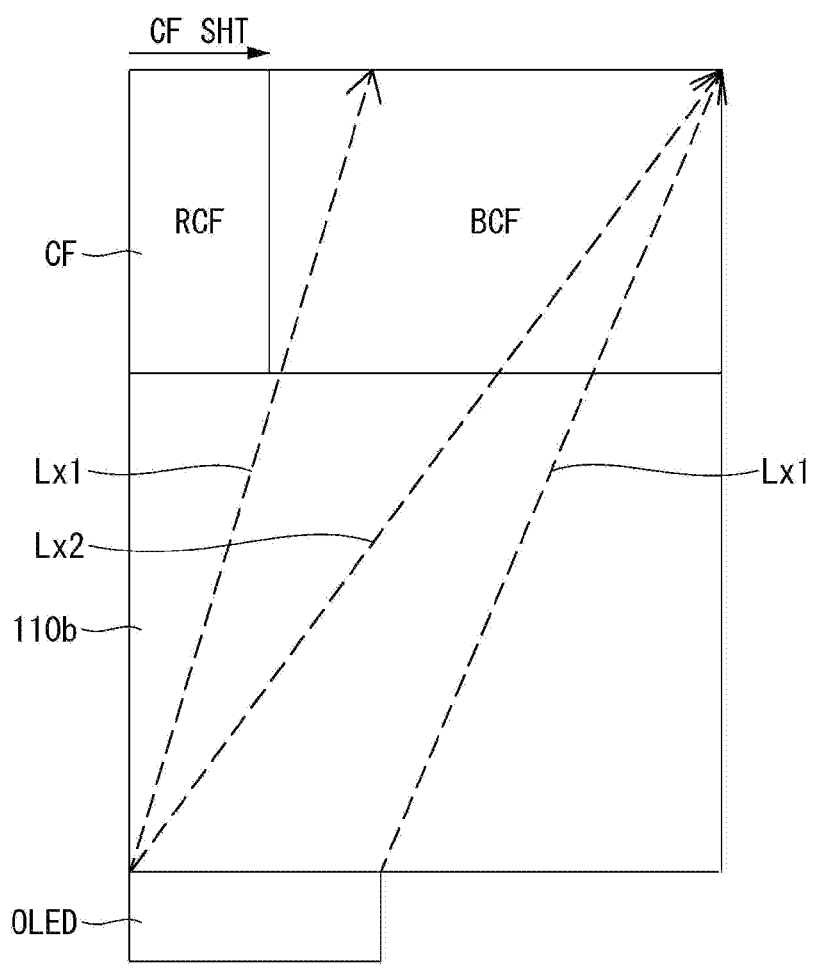
FIGS. 13 and 14 are views for explaining problems with the test example.
Figure 14:
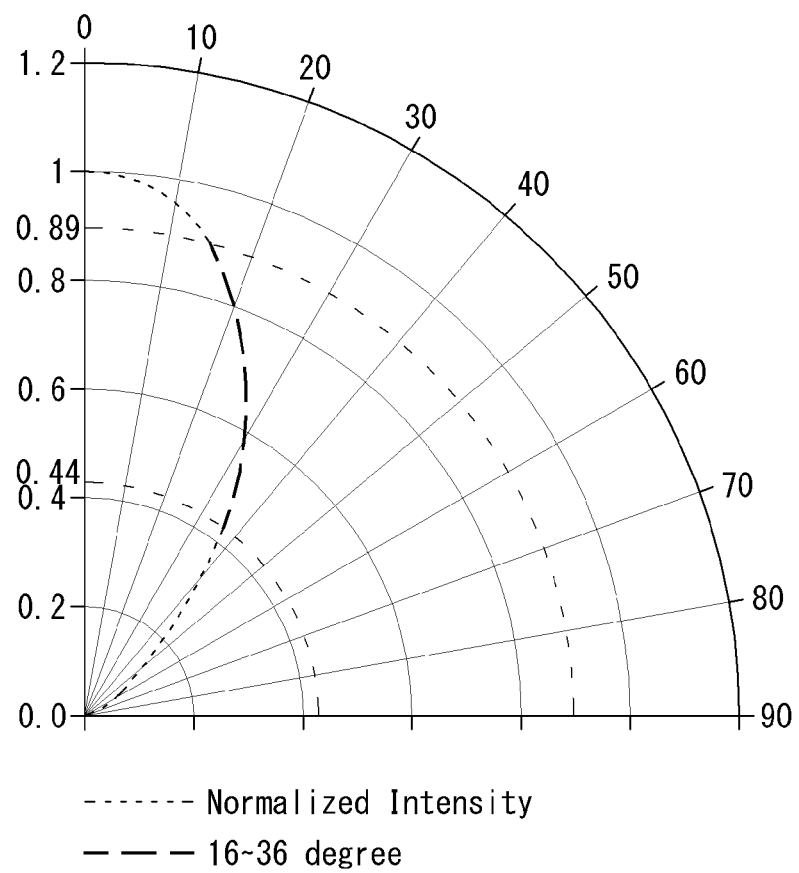

FIGS. 11 and 12 are cross-sectional views showing primary components of a display panel in an eyeglasses-like augmented reality device according to a test example and the directions in which they emit light. FIGS. 13 and 14 are views for explaining problems with the test example.

As shown in FIGS. 10, 11, and 12, the display panel 110 used in the eyeglasses-like augmented reality device according to the test example is implemented based on organic light-emitting diodes OLED that emit white light and a color filter layer CF that filters white light into red, green, or blue.

The display panel 110 has blue, green, and red subpixels SPB, SPG, and SPR that are defined between the lower substrate 110a and the upper substrate 110b. The blue, green, and red subpixels SPB, SPG, and SPR each have a transistor DR, an organic light-emitting diode OLED, as shown in FIGS. 2, 3A and 3B and a color filter layer CF, and the stack structure of them will be described below.

It should be noted that the transistor DR has a number of parts that are not shown separately but, by way of example, the transistor parts are included in the lower substrate 110a. This is because the transistor components vary greatly, including a gate electrode like a top-gate electrode or bottom-gate electrode and a semiconductor layer like CMOS, PMOS, or NMOS semiconductor, depending on the various processes that can be selected to be used to make the display panel 110.

A first metal layer TFTC lies on the lower substrate 110a. The first metal layer TFTC may serve as a source or drain electrode layer of a driving transistor in the transistor part or as a separate metal layer connected to it. The first metal layer TFTC acts as a metal layer for electrode contact that facilitates an electrical connection between the source or drain electrode of the driving transistor and a lower electrode layer E1 of the organic light-emitting diode OLED.

The transistor DR includes a first insulating layer PLL lies over the lower substrate 110a. The first insulating layer PLL covers the first metal layer TFTC. The first insulating layer PLL may be made of an organic material that helps flatten the surface—for example, but not limited to, a negative overcoat layer, polyimide, benzocyclobutene series resin, acrylate, or photoacrylate.

A second metal layer CNT is placed to penetrate through the first insulating layer PLL. The second metal layer CNT is electrically connected to the first metal layer TFTC exposed under the first insulating layer PLL. The second metal layer CNT acts as a metal layer for electrode contact that facilitates an electrical connection between the source or drain electrode of the driving transistor and the lower electrode layer E1 of the organic light-emitting diode OLED.

A third metal layer REM lies on the first insulating layer PLL. The third metal layer REM is electrically connected to the second metal layer CNT penetrating through the first insulating layer PLL. The third metal layer REM and the second metal layer CNT may be formed either as a single layer or as separate layers as shown in the drawings. The third metal layer REM acts as a reflective layer that helps a light-emitting layer EL emit light from the top, and also acts as a metal layer for electrode contact, along with the first and second metal layers TFTC and CNT, that facilitates an electrical connection between the source or drain electrode of the driving transistor and the lower electrode layer E1 of the organic light-emitting diode OLED.

A dielectric layer DIL lies over the first insulating layer PLL. The dielectric layer DIL varies in thickness to have a different resonance structure (microcavity) for each subpixel. For example, the thickness of the dielectric layer DIL may vary in order from thickest to thinnest for each of the blue subpixel SPB (first thickness), green subpixel SPG (second thickness), and red subpixel SPR (third thickness). As a result, the dielectric layer DIL may have a stepped shape in which the surface height varies for each subpixel. However, this is merely an example, and the thickness of the dielectric layer DIL may vary depending on the optical and electrical properties of the subpixels, such as luminous efficiency or lifetime.

The lower electrode layer E1 lies on the dielectric layer DIL. The lower electrode layer E1 may be the anode or cathode of the organic light-emitting diode OLED. The lower electrode layer E1 is positioned differently in the blue, green, and red subpixels SPB, SPG, and SPR. The lower electrode layer E1 is electrically connected to the source or drain electrode of the driving transistor in the lower substrate 110a via the third metal layer REM, but that connection is not shown in these figures.

A bank layer BNK lies on the dielectric layer DIL. The bank layer BNK divides the lower electrode layer E1 for each subpixel and defines an opening area (light-emitting area). To this end, the bank layer BNK covers the lower electrode layer E1 and exposes part of it. The bank layer BNK may be made of an organic material, but not limited to, a negative overcoat layer, polyimide, benzocyclobutene series resin, acrylate, or photoacrylate.

The light-emitting layer EL lies over the lower electrode layer E1. Although the light-emitting layer EL is illustrated as lying over the bank layer BNK as well as over the lower electrode layer E1, it may lie over the lower electrode layer E1 alone. The light-emitting layer EL may emit, but not limited to, white light. The light-emitting layer EL may have a single light-emitting layer or at least two light-emitting layers.

An upper electrode layer E2 lies over the light-emitting layer EL. The upper electrode layer E2 may be an anode or cathode. The upper electrode layer E2 is formed over the entire surface of the display area so as to fully cover the light-emitting layer EL in the blue, green, and red subpixels SPB, SPG, and SPR. The upper electrode layer E2 is made of a material that can emit light from the light-emitting layer EL toward the upper substrate 110b.

The upper substrate 110b lies over the upper electrode layer E2. The upper substrate 110b may be composed of a single layer of an organic or inorganic material, or multiple layers of a plurality of alternating organic and inorganic materials.

The color filter layer CF lies on the upper substrate 110b. For example, the color filter layer CF may comprise, but is not limited to, a blue color filter BCF, a green color filter GCF, and a red color filter RCF. The blue color filter BCF, the green color filter GCF, and the red color filter RCF do not align with or exactly correspond to the blue subpixel SPB, the green subpixel SPG, and the red subpixel SPR but are shifted a selected distance CF SHT in the directions of neighboring subpixels.

A resin layer RES may lie on the color filter layer CF, and a cover substrate GLS may lie on the resin layer RES. However, this is merely an example, but the positional relationship may vary depending on the manufacturing method of the display panel 110. Thus, one of these layers may be omitted, or other layers may be added.

In the test example, the color filter layer CF, which is one of the components included in the display panel 110, is shifted a selected distance CF SHT to reduce the size of the optical lens 180. Particularly, in the test example, the blue color filter BCF, green color filter GCF, and red color filter RCF in the top display area TOP and bottom display area BOT of the display panel 110 are shifted a selected distance CF SHT as follows.

For example, the blue color filter BCF is shifted a selected distanceCF SHT in the direction of the green subpixel SPG, the green color filter GCF is shifted a selected distance CF SHT in the direction of the red subpixel SPR, and the red color filter RCF is shifted a selected distance CF SHT in the direction of the blue subpixel SPB. As a result, the blue color filter BCF occupies part of the blue subpixel SPB and part of the green subpixel SPG, the green color filter GCF occupies part of the green subpixel SPG and part of the red color filter RCF, and the red color filter RCF occupies part of the red subpixel SPR and part of the blue subpixel SPB. In plain terms, each color filter is positioned to be aligned with part of a first subpixel and part of a second subpixel.

If the color filter layer CF in the top display area TOP of the display panel 110 is shifted in the above direction, the color filter layer CF in the bottom display area BOT of the display panel 110 is shifted in the opposite direction.

In the test example, it was learned that, by shifting a selected distance CF SHT the color filter layer CF in the top display area TOP and bottom display area BOT of the display panel 110, an image, which is light, in the top display area TOP and bottom display area BOT of the display panel 110 could be focused towards the middle display area MID. This is because the light path changes as the color filter layer CF in the top display area TOP and bottom display area BOT of the display panel 110 is shifted toward the middle display area MID.

As shown in FIGS. 13 and 14, numerous tests were conducted based on the test example, and the results show that, by moving the color filter layer CF about 1.6 µm, the brightness changes along with the optical axis of the organic light-emitting diode OLED.

For instance, if the optical axis of the organic light-emitting diode OLED is shifted about 16° from the first optical axis Lx1, the brightness is reduced by about 11%. Furthermore, if the optical axis of the organic light-emitting diode OLED is shifted about 36° from the second optical axis Lx2, the brightness is reduced by about 56%. Also, it was revealed that, in the test example, the light emitted in a straight line from the organic light-emitting diode OLED was of little use but the light emitted at 16° to 36° (from a shifted optical axis or angle) was mainly used.

It should be noted that, in FIGS. 13 and 14, the term "vertical" is defined to be 0° and the term "horizontal" is defined to be 90° to illustrate that light is emitted vertically from the organic light-emitting diode OLED.

From the above test example, the following conclusion can be drawn.

If the color filter layer is shifted as in the test example, the light emitted from the organic light-emitting diode's shifted optical axis (shifted angle) is mainly used. Since the test example provides a resonance structure (microcavity) optimized for vertically-emitted light, even a slight increase (deviation) in the angle of the emitted light leads to a sudden change in the brightness and chromatic characteristics of the display panel. Due to this, shifting only the color filter layer as in the test example may cause much loss of brightness. Therefore, it is beneficial to reduce the brightness loss, in order to apply a display panel with a resonance structure according to the test example to an augmented reality device which requires high brightness.

First Exemplary Embodiment

Figure 15:
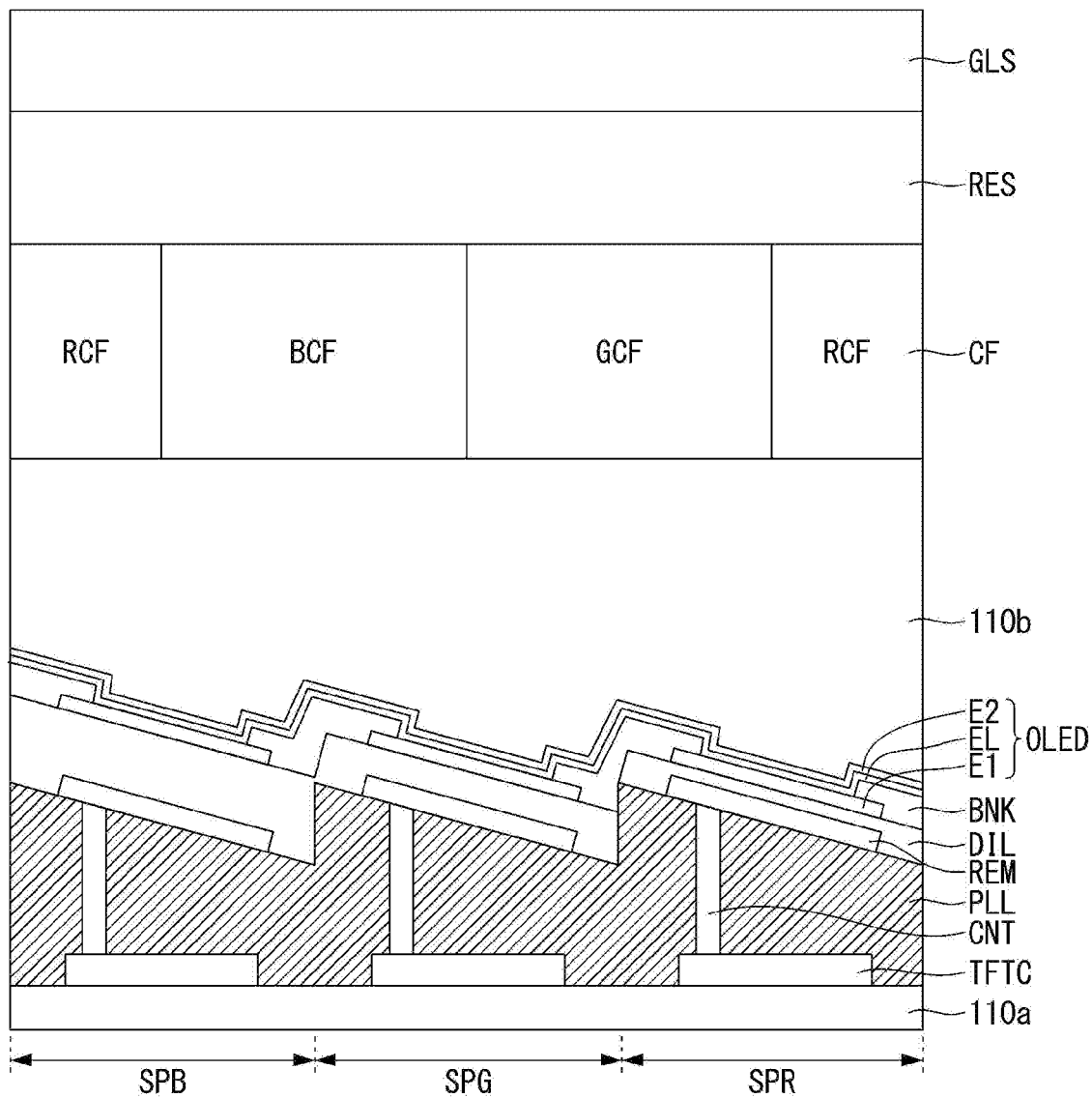
FIGS. 15 and 16 are cross-sectional views showing primary components of a display panel in an eyeglasses-like augmented reality device according to a first exemplary embodiment of the present disclosure and the directions in which they emit light.
Figure 16:
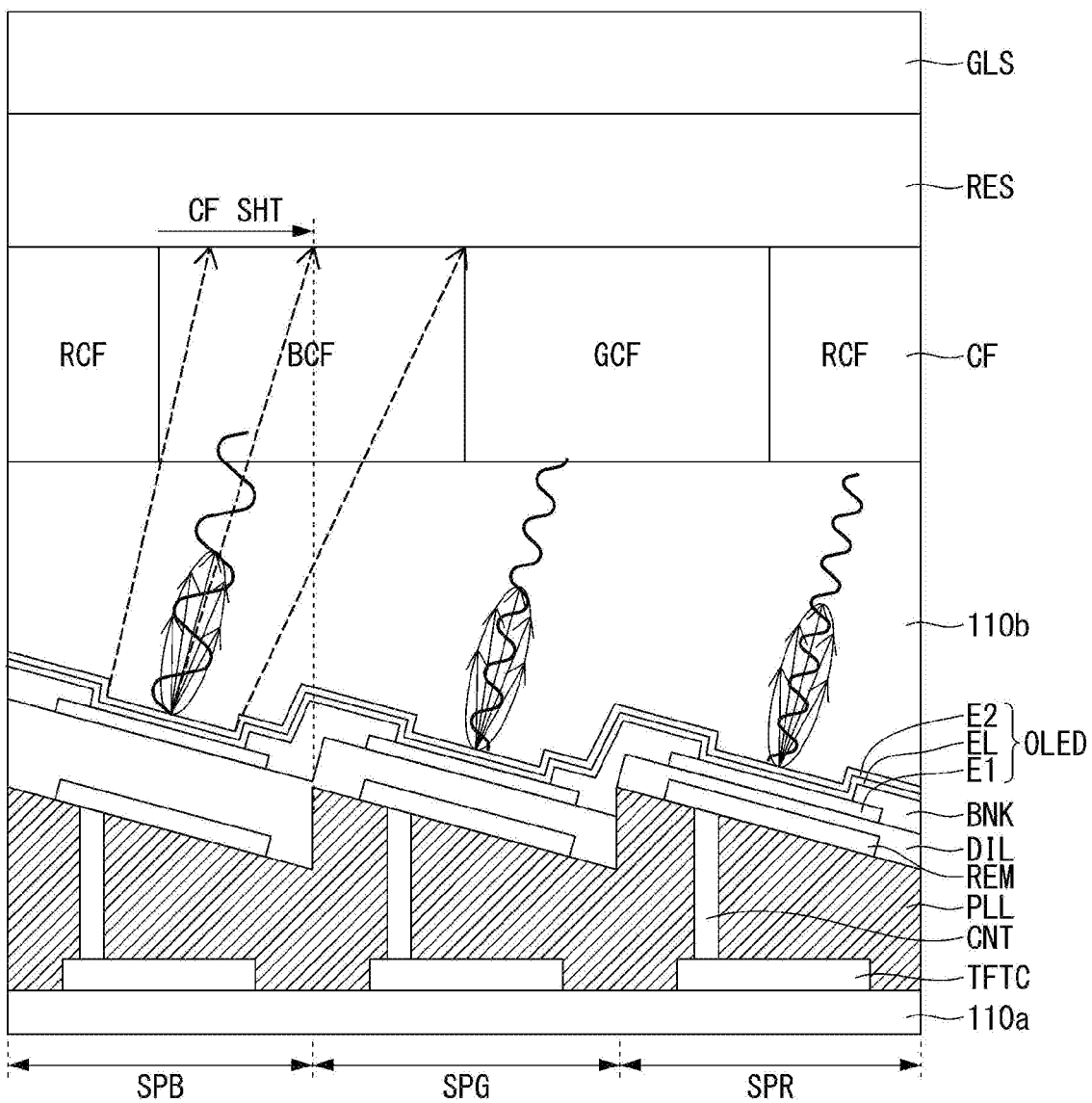
Figure 17:
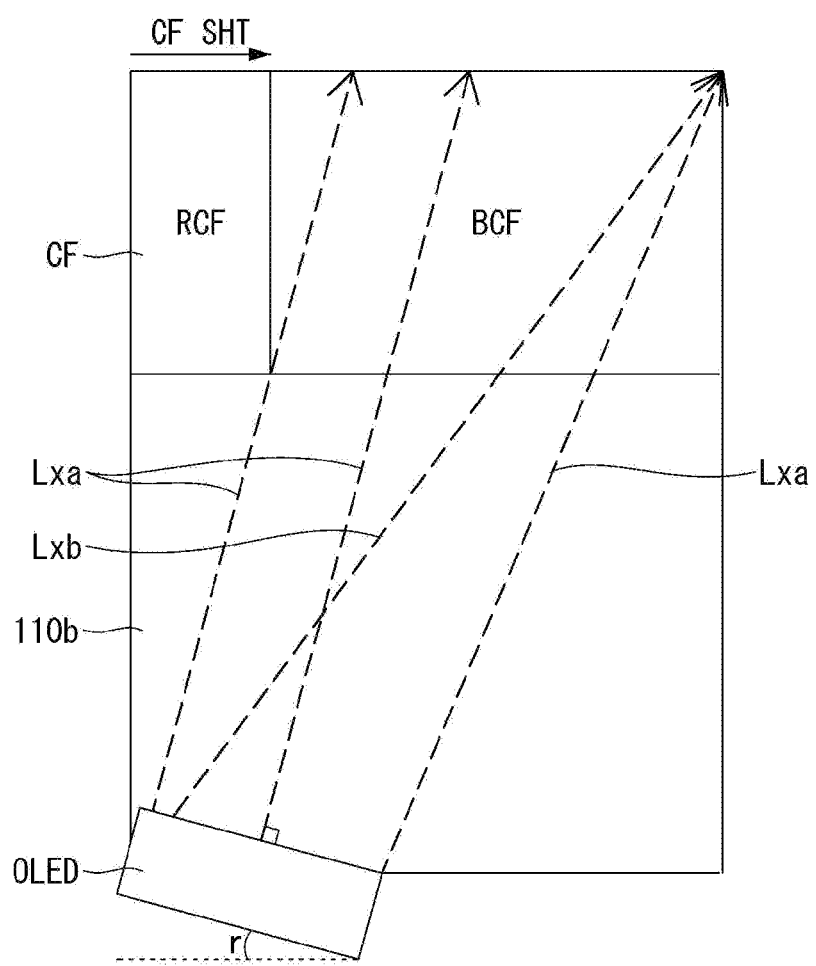
FIGS. 17 and 18 are views for explaining improvements according to the first exemplary embodiment.
Figure 18:
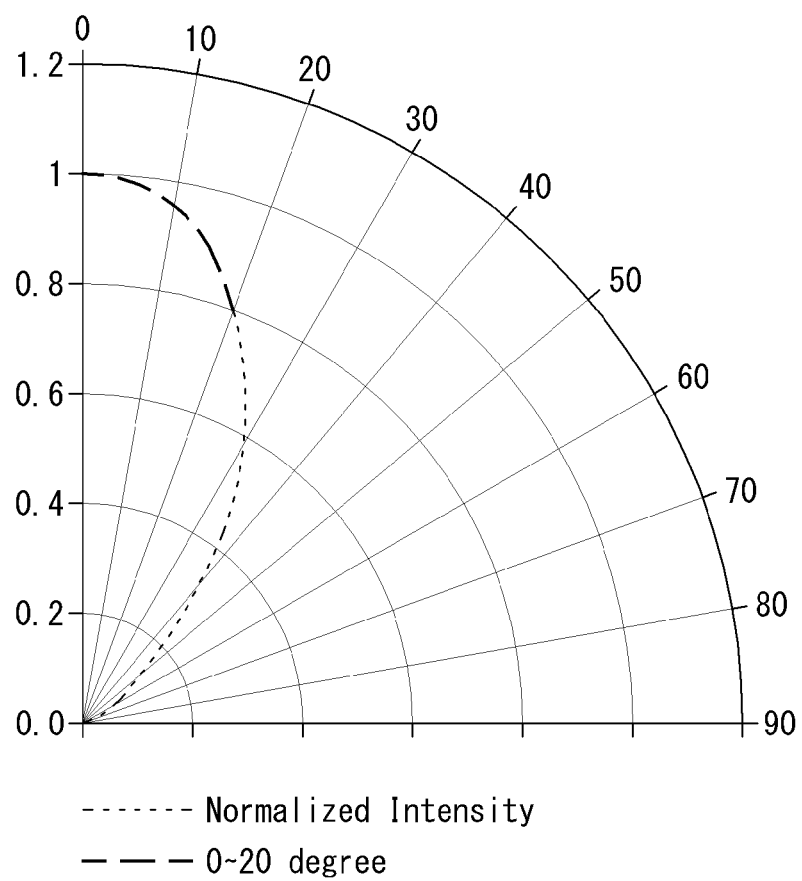

FIGS. 15 and 16 are cross-sectional views showing primary components of a display panel in an eyeglasses-like augmented reality device according to a first exemplary embodiment of the present disclosure and the directions in which they emit light. FIGS. 17 and 18 are views for explaining improvements according to the first exemplary embodiment.

As shown in FIGS. 10, 15, and 16, the display panel 110 used in the eyeglasses-like augmented reality device according to the first exemplary embodiment is implemented based on organic light-emitting diodes OLED that emit white light and a color filter layer CF that filters white light into red, green, or blue.

The display panel 110 has blue, green, and red subpixels SPB, SPG, and SPR that are defined between the lower substrate 110a and the upper substrate 110b. The blue, green, and red subpixels SPB, SPG, and SPR each have a transistor part, an organic light-emitting diode OLED, and a color filter layer CF, and the stack structure of them will be described below.

It should be noted that the transistor part is not shown separately but, by way of example, the transistor part is included in the lower substrate 110a. This is because the transistor components vary greatly, including a gate electrode like a top-gate electrode or bottom-gate electrode and a semiconductor layer like CMOS, PMOS, or NMOS semiconductor, mentioned with respect to FIG. 11.

A first metal layer TFTC lies on the lower substrate 110a. The first metal layer TFTC may serve as a source or drain electrode layer of a driving transistor in the transistor part or as a separate metal layer connected to it. The first metal layer TFTC acts as a metal layer for electrode contact that facilitates an electrical connection between the source or drain electrode of the driving transistor and a lower electrode layer E1 of the organic light-emitting diode OLED.

A first insulating layer PLL lies over the lower substrate 110a. The first insulating layer PLL covers the first metal layer TFTC. The first insulating layer PLL may be made of an organic material that helps flatten the surface—for example, but not limited to, a negative overcoat layer, polyimide, benzocyclobutene series resin, acrylate, or photoacrylate.

The first insulating layer PLL has a flat, horizontal surface on the whole but a flat, sloped surface in some parts of the display area of the display panel 110 (or in some parts of the lower substrate). The surface of the first insulating layer PLL may be sloped by photographic and etching techniques. The first insulating layer PLL may be made thick with a flat, horizontal upper surface, and then partially patterned and removed so as to have a sloped surface in some parts of the display panel 110, but not limited to it.

The first insulating layer PLL may have different slopes for different positions in the display area of the display panel 110, or, as stated below, it may have a specific slope at a selected location relative to the middle display area MID of the display panel 110. The surface of the first insulating layer PLL may be sloped only in the top display area TOP and bottom display area BOT of the display panel 110. That is, the first insulating layer PLL in the middle display area MID of the display panel 110 has a flat, horizontal surface, whereas the first insulating layer PLL in the top display area TOP and bottom display area BOT of the display panel 110 has a sloped surface toward the middle display area MID. Moreover, the position and size of the sloped surface of the first insulating layer PLL may vary between the subpixels SPB, SPG, and SPR and also based on the location of the pixel relative to the MID.

A second metal layer CNT is placed to penetrate through the first insulating layer PLL. The second metal layer CNT is electrically connected to the first metal layer TFTC exposed under the first insulating layer PLL. The second metal layer CNT acts as a metal layer for electrode contact that facilitates an electrical connection between the source or drain electrode of the driving transistor and the lower electrode layer E1 of the organic light-emitting diode OLED.

A third metal layer REM lies on the first insulating layer PLL. The third metal layer REM is electrically connected to the second metal layer CNT penetrating through the first insulating layer PLL. The third metal layer REM and the second metal layer CNT may be formed either as a single layer or as separate layers as shown in the drawings. The third metal layer REM acts as a reflective layer that helps a light-emitting layer EL emit light from the top, and also acts as a metal layer for an electrode contact, along with the first and second metal layers TFTC and CNT, that facilitates an electrical connection between the source or drain electrode of the driving transistor and the lower electrode layer E1 of the organic light-emitting diode OLED. The third metal layer REM has a slope corresponding to the sloped surface of the first insulating layer PLL.

A dielectric layer DIL lies over the first insulating layer PLL. The dielectric layer DIL varies in thickness to have a different resonance structure (microcavity) for each subpixel. For example, the thickness of the dielectric layer DIL may be in order from thickest to thinnest for each of the blue subpixel SPB (first thickness), green subpixel SPG (second thickness), and red subpixel SPR (third thickness). As a result, the dielectric layer DIL may have a stepped shape in which the surface height varies for each subpixel. However, this is merely an example, and the thickness of the dielectric layer DIL may vary depending on the optical and electrical properties of the subpixels, such as luminous efficiency or lifetime. The dielectric layer DIL has a slope corresponding to the sloped surface of the first insulating layer PLL.

The lower electrode layer E1 lies on the dielectric layer DIL. The lower electrode layer E1 may be the anode or cathode of the organic light-emitting diode OLED. The lower electrode layer E1 is positioned differently in the blue, green, and red subpixels SPB, SPG, and SPR. The lower electrode layer E1 is electrically connected to the source or drain electrode of the driving transistor in the lower substrate 110a via the third metal layer REM. The lower electrode layer E1 has a slope corresponding to the sloped surface of the first insulating layer PLL.

A bank layer BNK lies on the dielectric layer DIL. The bank layer BNK divides the lower electrode layer E1 for each subpixel and defines an opening area (light-emitting area). To this end, the bank layer BNK covers the lower electrode layer E1 and exposes part of it. The bank layer BNK may be made of an organic material, but not limited to, a negative overcoat layer, polyimide, benzocyclobutene series resin, acrylate, or photoacrylate. The bank layer BNK has a slope corresponding to the sloped surface of the first insulating layer PLL.

The light-emitting layer EL lies over the lower electrode layer E1. Although the light-emitting layer EL is illustrated as lying over the bank layer BNK as well as over the lower electrode layer E1, it may lie over the lower electrode layer E1 alone. The light-emitting layer EL may emit, but is not limited to, white light. The light-emitting layer EL may have a single light-emitting layer or at least two light-emitting layers. The light-emitting layer EL has a slope corresponding to the sloped surface of the first insulating layer PLL.

An upper electrode layer E2 lies over the light-emitting layer EL. The upper electrode layer E2 may be the anode or cathode of the organic light-emitting diode OLED. The upper electrode layer E2 is formed over the entire surface of the display area so as to fully cover the light-emitting layer EL in the blue, green, and red subpixels SPB, SPG, and SPR. The upper electrode layer E2 is made of a material that can emit light from the light-emitting layer EL toward the upper substrate 110b. The upper electrode layer E2 has a slope corresponding to the sloped surface of the first insulating layer PLL.

The upper substrate 110b lies over the upper electrode layer E2. The upper substrate 110b may be composed of a single layer of an organic or inorganic material, or multiple layers of a plurality of alternating organic and inorganic materials. The upper substrate 110b may have a flat surface. The upper substrate 110b acts to seal and protect the elements or wires on the lower substrate 110a.

The color filter layer CF lies on the upper substrate 110b. For example, the color filter layer CF may comprise, but not limited to, a blue color filter BCF, a green color filter GCF, and a red color filter RCF. The blue color filter BCF, the green color filter GCF, and the red color filter RCF do not correspond to the blue subpixel SPB, the green subpixel SPG, and the red subpixel SPR but are shifted a selected distance CF SHT in the directions of neighboring subpixels. In plain terms, each color filter is positioned to align with part of a first subpixel and part of a second subpixel.

A resin layer RES may lie on the color filter layer CF, and a cover substrate GLS may lie on the resin layer RES. However, this is merely an example, but the positional relationship may vary depending on the manufacturing method of the display panel 110. Thus, one of these layers may be omitted, or other layers may be added.

In the first exemplary, the color filter layer CF, which is one of the components included in the display panel 110, is shifted a selected distance CF SHT to reduce the size of the optical lens 180, and the surface of the first insulating layer PLL is flattened and sloped. Particularly, in the first exemplary embodiment, the blue color filter BCF, green color filter GCF, and red color filter RCF in the top display area TOP and bottom display area BOT of the display panel 110 are shifted a selected distance CF SHT as follows.

For example, the blue color filter BCF is shifted a selected distance CF SHT in the direction of the green subpixel SPG, the green color filter GCF is shifted a selected distance CF SHT in the direction of the red subpixel SPR, and the red color filter RCF is shifted a selected distance CF SHT in the direction of the blue subpixel SPB. As a result, the blue color filter BCF occupies part of the blue subpixel SPB and part of the green subpixel SPG, the green color filter GCF occupies part of the green subpixel SPG and part of the red color filter RCF, and the red color filter RCF occupies part of the red subpixel SPR and part of the blue subpixel SPB. If the color filter layer CF in the top display area TOP of the display panel 110 is shifted in the above direction, the color filter layer CF in the bottom display area BOT of the display panel 110 is shifted in the opposite direction. The selected distance for the shift CF SHT might be the same distance for each pixel and each subpixel within a particular pixel in some embodiments and it might be a different distance for different pixels or for particular subpixels within a pixel.

Moreover, in the first exemplary embodiment, the surface of the first insulating layer PLL is sloped so that the organic light-emitting diode OLED underlying the shifted (CF SHT) blue color filter BCF, green color filter GCF, and red color filter RCF emits an image, which is light, at a sloping angle. The angle of slope of the first insulating layer PLL may be selected based on the materials, positions (particularly, the distances the color filters are moved), thicknesses, refractive indices, and transmittances of all components positioned in the direction in which the organic light-emitting diode OLED emits light.

For example, the surface of the first insulating layer PLL in the top display area TOP of the display panel 110 is sloped in such a way that a first side of the organic light-emitting diode OLED in the blue subpixel SPB has a steeper slope than a second side, i.e., the opposite side. On the other hand, the surface of the first insulating layer PLL in the bottom display area BOT of the display panel 110 is sloped in such a way that the second side of the organic light-emitting diode OLED in the blue subpixel SPB has a steeper slope than the first side, i.e., the opposite side. The surface of the first insulating layer PLL in the top display area TOP of the display panel 110 is sloped in such a way that the first side of the organic light-emitting diode OLED in the green subpixel SPG has a steeper slope than the second side, i.e., the opposite side. On the other hand, the surface of the first insulating layer PLL in the bottom display area BOT of the display panel 110 is sloped in such a way that the second side of the organic light-emitting diode OLED in the green subpixel SPG has a steeper slope than the first side, i.e., the opposite side. The surface of the first insulating layer PLL in the top display area TOP of the display panel 110 is sloped in such a way that the first side of the organic light-emitting diode OLED in the red subpixel SPR has a steeper slope than the second side, i.e., the opposite side. On the other hand, the surface of the first insulating layer PLL in the bottom display area BOT of the display panel 110 is sloped in such a way that the second side of the organic light-emitting diode OLED in the red subpixel SPR has a steeper slope than the first side, i.e., the opposite side. The first and second sides of the organic light-emitting diode OLED may be defined to be on the long axis or short axis of the subpixels SPB, SPG, and SPR, for example.

In the first exemplary embodiment, it was learned that, by shifting (CF SHT) the color filter layer CF in the top display area TOP and bottom display area BOT of the display panel 110, an image which is light, in the top display area TOP and bottom display area BOT of the display panel 110 could be focused to the middle display area MID. This is because the light path changes as the color filter layer CF in the top display area TOP and bottom display area BOT of the display panel 110 is shifted toward the middle display area MID.

Moreover, in the first exemplary embodiment, it was learned that, by sloping the surface of the first insulating layer PLL to allow the organic light-emitting diode OLED to emit an image which is light, at a sloping angle, it is possible to improve or prevent problems like abrupt changes in the brightness and chromatic characteristics of the top display area TOP and bottom display area BOT of the display panel 110. This is because the optical axis of the organic light-emitting diode OLED in the top display area TOP and bottom display area BOT of the display panel 110 is shifted toward the shifted color filter layer CF and therefore there is little deviation in the optimal angle of light emission for the resonance structure (microcavity).

As shown in FIGS. 17 and 18, numerous tests were conducted based on the first exemplary embodiment, and the results show that, by moving the color filter layer CF about 1.6 μm and giving the organic light-emitting diode OLED a slope (r) of about 16°, most of the first optical axis Lxa and second optical axis Lxb can be used without being shifted. Moreover, it was learned that the structure of the first exemplary embodiment makes use of both the light emitted in a straight line from the organic light-emitting diode OLED and the light emitted at a certain angle—that is, from 0° to 20°.

As a consequence, in the first exemplary embodiment, the light path is not constrained by the shifted optical axis, unlike in the test example. Thus, the first optical axis Lxa, which is vertical, and the second optical axis Lxb, which is at a certain angle, are both included in the effective brightness range of the organic light-emitting diode OLED, and hence there is little decrease in brightness.

Therefore, in the first exemplary embodiment, the lower part where the organic light-emitting diode OLED is located is sloped at a specific angle to correspond to the distance the color filter layer CF is moved, so as to keep the optical axis from deviating from the preferred angle for the resonance structure as much as possible.

It should be noted that, in FIGS. 17 and 18, the term "vertical" is defined to be 0° and the term "horizontal" is defined to be 90° to illustrate that light is emitted vertically from the organic light-emitting diode OLED.

As above, in the first exemplary embodiment, the light emitted from the intrinsic optical axis of organic light emitting diode may be directly used. Moreover, in the first exemplary embodiment, a slope is provided so as to make use of most of the resonance structure (microcavity) optimized for vertically-emitted light, and this leads to a change in the angle of light emission, thereby preventing changes in the brightness and chromatic characteristics of the display panel. As a result, in the first exemplary embodiment, there is no loss in the brightness of the display panel with the resonance structure, and the display panel is readily applicable to augmented reality devices which require high brightness and other devices.

Second Exemplary Embodiment

Figure 19:
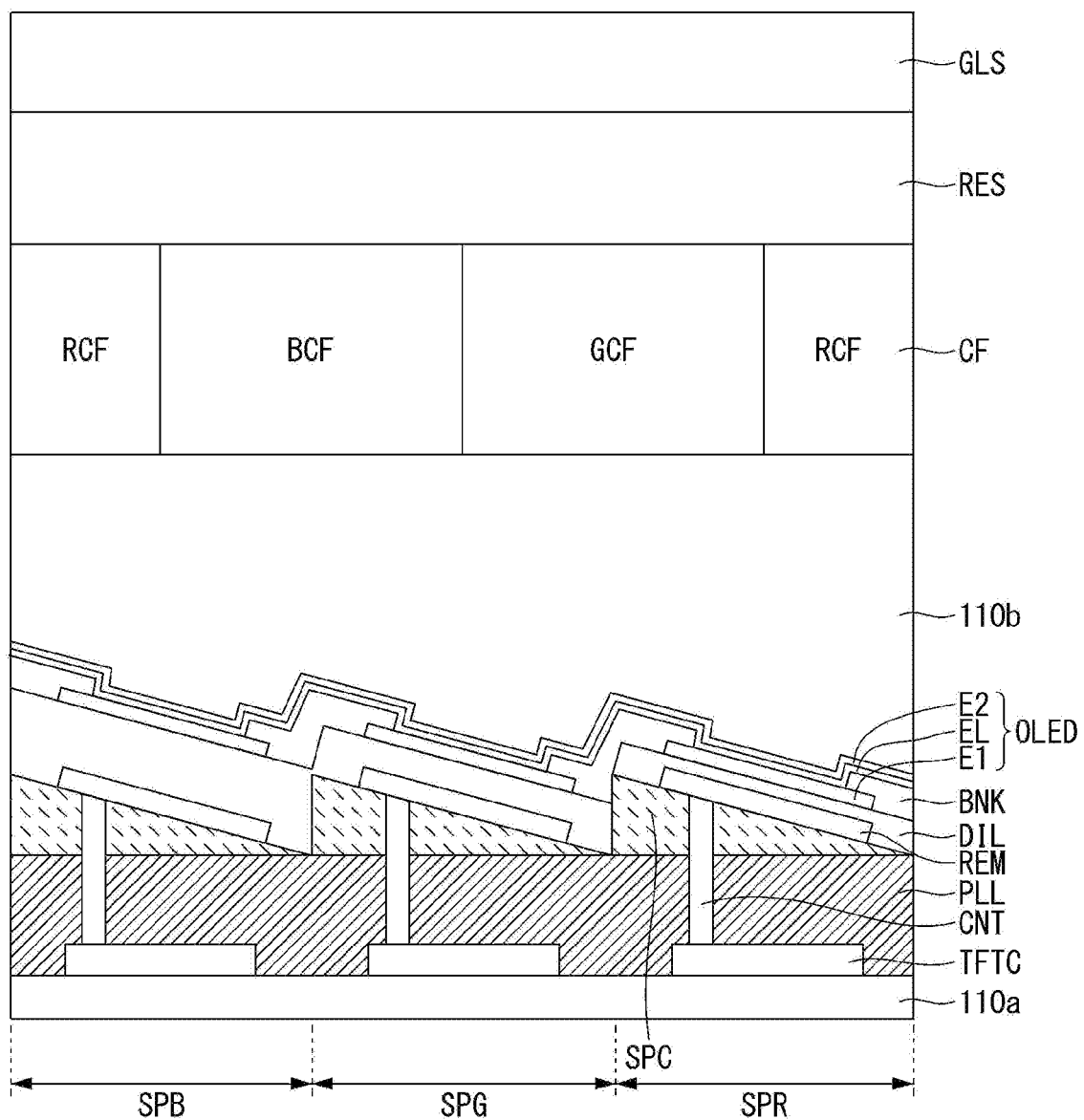
FIGS. 19 and 20 are cross-sectional views showing primary components of a display panel in an eyeglasses-like augmented reality device according to a second exemplary embodiment of the present disclosure and the directions in which they emit light.
Figure 20:
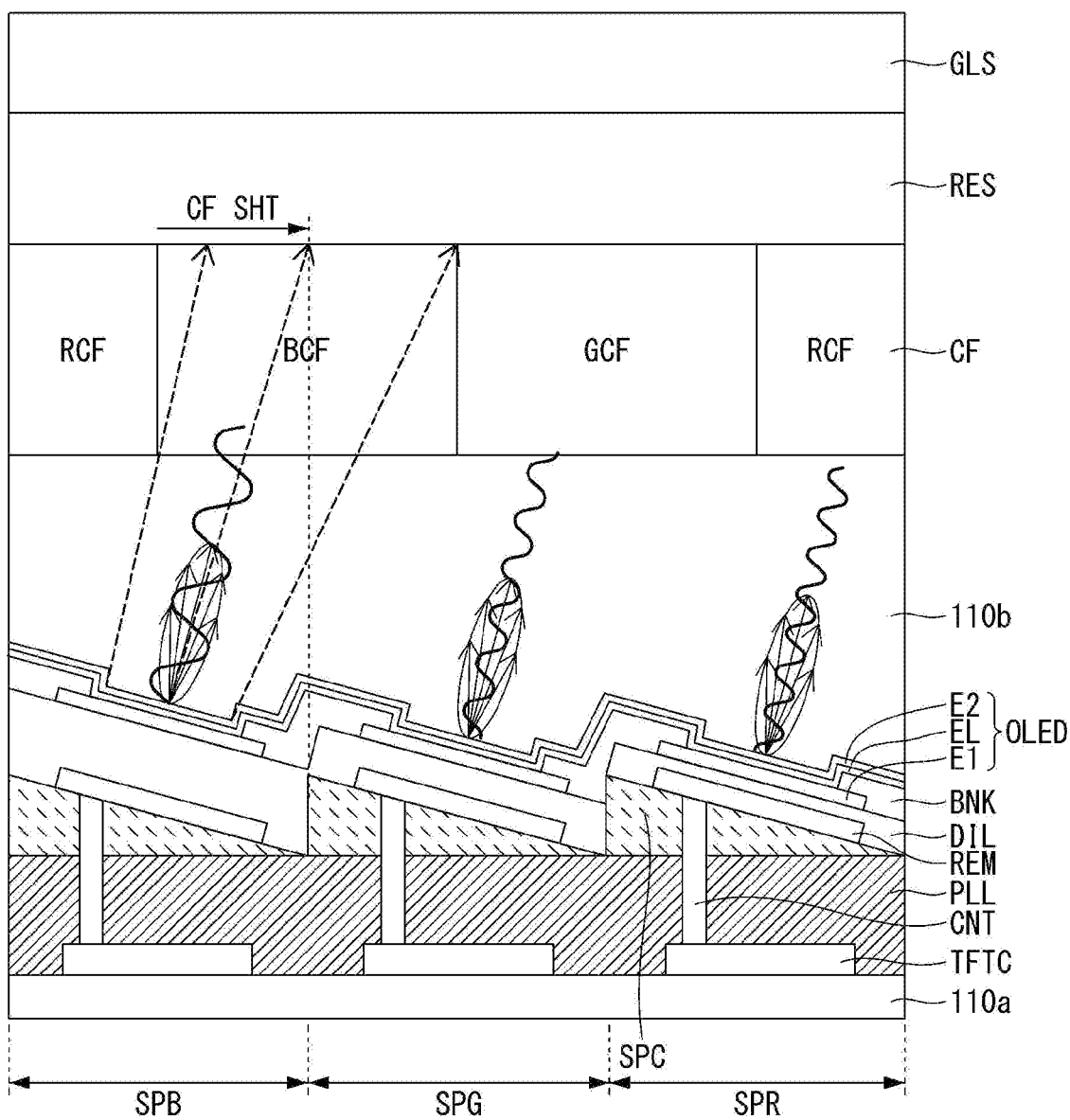

FIGS. 19 and 20 are cross-sectional views showing primary components of a display panel in an eyeglasses-like augmented reality device 100 according to a second exemplary embodiment of the present disclosure and the directions in which they emit light.

As shown in FIGS. 10, 19, and 20, the display panel 110 used in the eyeglasses-like augmented reality device 100 according to the second exemplary embodiment is implemented based on organic light-emitting diodes OLED that emit white light and a color filter layer CF that filters white light into red, green, or blue.

The display panel 110 has blue, green, and red subpixels SPB, SPG, and SPR that are defined between the lower substrate 110a and the upper substrate 110b. The blue, green, and red subpixels SPB, SPG, and SPR each have a transistor DR, an organic light-emitting diode OLED, see FIGS. 2, 3A and 3B, and a color filter layer CF, and the stack structure of them will be described below.

It should be noted that the transistor DR is not shown separately but, by way of example, the transistor DR is included in the lower substrate 110a. This is because the transistor components vary greatly, a gate electrode like a top-gate electrode or bottom-gate electrode and a semiconductor layer like CMOS, PMOS, or NMOS semiconductor.

A first metal layer TFTC lies on the lower substrate 110a. The first metal layer TFTC may serve as a source or drain electrode layer of a driving transistor in the transistor part or as a separate metal layer connected to it. The first metal layer TFTC acts as a metal layer for electrode contact that facilitates an electrical connection between the source or drain electrode of the driving transistor and a lower electrode layer E1 of the organic light-emitting diode OLED.

A first insulating layer PLL lies over the lower substrate 110a. The first insulating layer PLL covers the first metal layer TFTC. The first insulating layer PLL may be made of an organic material that helps flatten the surface—for example, but not limited to, a negative overcoat layer, polyimide, benzocyclobutene series resin, acrylate, or photoacrylate.

A second insulating layer SPC lies on the first insulating layer PLL. The second insulating layer SPC is located in the display area of the display panel 110 (or in some parts of the lower substrate) and has a sloped surface. The surface of the second insulating layer SPC may be sloped by photographic and etching techniques. The second insulating layer SPC thus formed may be located only in some area and have a sloped surface in that area, but not limited to it.

The second insulating layer SPC may have different slopes for different positions in the display area of the display panel 110, or, as below, it may have a specific slope relative to the middle display area MID of the display panel 110. The surface of the second insulating layer SPC may be sloped only in the top display area TOP and bottom display area BOT of the display panel 110. That is, the second insulating layer SPC does not exist in the middle display area MID of the display panel 110 but the second insulating layer SPC exists in the top display area TOP and bottom display area BOT of the display panel 110 and has a sloped surface toward the middle display area MID. Moreover, the position and size of the sloped surface of the second insulating layer SPC vary between the subpixels SPB, SPG, and SPR.

A second metal layer CNT is placed to penetrate through the first insulating layer PLL and the second insulating layer SPC. The second metal layer CNT is electrically connected to the first metal layer TFTC exposed under the first insulating layer PLL. The second metal layer CNT acts as a metal layer for electrode contact that facilitates an electrical connection between the source or drain electrode of the driving transistor and the lower electrode layer E1 of the organic light-emitting diode OLED.

A third metal layer REM lies on the first insulating layer PLL. The third metal layer REM is electrically connected to the second metal layer CNT penetrating through the first insulating layer PLL. The third metal layer REM and the second metal layer CNT may be formed either as a single layer or as separate layers as shown in the drawings. The third metal layer REM acts as a reflective layer that helps a light-emitting layer EL emit light from the top, and also acts as a metal layer for electrode contact, along with the first and second metal layers TFTC and CNT, that facilitates an electrical connection between the source or drain electrode of the driving transistor and the lower electrode layer E1 of the organic light-emitting diode OLED. The third metal layer REM has a slope corresponding to the sloped surface of the second insulating layer SPC.

A dielectric layer DIL lies over the first insulating layer PLL. The dielectric layer DIL varies in thickness to have a different resonance structure (microcavity) for each subpixel. For example, the thickness of the dielectric layer DIL may vary in order from thickest to thinnest for each of the blue subpixel SPB (first thickness), green subpixel SPG (second thickness), and red subpixel SPR (third thickness). As a result, the dielectric layer DIL may have a stepped shape in which the surface height varies for each subpixel. However, this is merely an example, and the thickness of the dielectric layer DIL may vary depending on the optical and electrical properties of the subpixels, such as luminous efficiency or lifetime. The dielectric layer DIL has a slope corresponding to the sloped surface of the second insulating layer SPC.

The lower electrode layer E1 lies on the dielectric layer DIL. The lower electrode layer E1 may be the anode or cathode of the organic light-emitting diode OLED. The lower electrode layer E1 is positioned differently in the blue, green, and red subpixels SPB, SPG, and SPR. The lower electrode layer E1 is electrically connected to the source or drain electrode of the driving transistor in the lower substrate 110a via the third metal layer REM. The lower electrode layer E1 has a slope corresponding to the sloped surface of the second insulating layer SPC.

A bank layer BNK lies on the dielectric layer DIL. The bank layer BNK divides the lower electrode layer E1 for each subpixel and defines an opening area (light-emitting area). To this end, the bank layer BNK covers the lower electrode layer E1 and exposes part of it. The bank layer BNK may be made of an organic material, but not limited to, a negative overcoat layer, polyimide, benzocyclobutene series resin, acrylate, or photoacrylate. The bank layer BNK has a slope corresponding to the sloped surface of the second insulating layer SPC.

The light-emitting layer EL lies over the lower electrode layer E1. Although the light-emitting layer EL is illustrated as lying over the bank layer BNK as well as over the lower electrode layer E1, it may lie over the lower electrode layer E1 alone. The light-emitting layer EL may emit, but is not limited to, white light. The light-emitting layer EL may have a single light-emitting layer or at least two light-emitting layers. The light-emitting layer EL has a slope corresponding to the sloped surface of the second insulating layer SPC.

An upper electrode layer E2 lies over the light-emitting layer EL. The upper electrode layer E2 may be an anode or cathode. The upper electrode layer E2 is formed over the entire surface of the display area so as to fully cover the light-emitting layer EL in the blue, green, and red subpixels SPB, SPG, and SPR. The upper electrode layer E2 is made of a material that can emit light from the light-emitting layer EL toward the upper substrate 110b. The upper electrode layer E2 has a slope corresponding to the sloped surface of the second insulating layer SPC.

The upper substrate 110b lies over the upper electrode layer E2. The upper substrate 110b may be composed of a single layer of an organic or inorganic material, or multiple layers of a plurality of alternating organic and inorganic materials. The upper substrate 110b may have a flat surface. The upper substrate 110b acts to seal and protect the elements or wires on the lower substrate 110a.

The color filter layer CF lies on the upper substrate 110b. For example, the color filter layer CF may comprise, but not limited to, a blue color filter BCF, a green color filter GCF, and a red color filter RCF. The blue color filter BCF, the green color filter GCF, and the red color filter RCF do not correspond to the blue subpixel SPB, the green subpixel SPG, and the red subpixel SPR but are shifted a selected distance CF SHT in the directions of neighboring subpixels. In plain terms, each color filter is positioned to correspond part of a first subpixel and part of a second subpixel.

A resin layer RES may lie on the color filter layer CF, and a cover substrate GLS may lie on the resin layer RES. However, this is merely an example, but the positional relationship may vary depending on the manufacturing method of the display panel 110. Thus, one of these layers may be omitted, or other layers may be added.

In the second exemplary, the color filter layer CF, which is one of the components included in the display panel 110, is shifted a selected distance CF SHT to reduce the size of the optical lens 180, and the second insulating layer SPC with a sloped surface is formed on the first insulating layer PLL. Particularly, in the second exemplary embodiment, the blue color filter BCF, green color filter GCF, and red color filter RCF in the top display area TOP and bottom display area BOT of the display panel 110 are shifted (CF SHT) as follows.

For example, the blue color filter BCF is shifted a selected distance CF SHT in the direction of the green subpixel SPG, the green color filter GCF is shifted a selected distance CF SHT in the direction of the red subpixel SPR, and the red color filter RCF is shifted a selected distance CF SHT in the direction of the blue subpixel SPB. As a result, the blue color filter BCF occupies part of the blue subpixel SPB and part of the green subpixel SPG, the green color filter GCF occupies part of the green subpixel SPG and part of the red color filter RCF, and the red color filter RCF occupies part of the red subpixel SPR and part of the blue subpixel SPB.

Moreover, in the second exemplary embodiment, the second insulating layer SPC with a sloped surface is formed on the first insulating layer PLL so that the organic light-emitting diode OLED underlying the shifted a selected distance CF SHT blue color filter BCF, green color filter GCF, and red color filter RCF emits an image which is light, at a sloping angle. The angle of slope of the second insulating layer SPC may be optimized based on the materials, positions (particularly, the moving distances of the color filters), thicknesses, refractive indices, and transmittances of all components positioned in the direction in which the organic light-emitting diode OLED emits light.

For example, the surface of the second insulating layer SPC in the top display area TOP of the display panel 110 is sloped in such a way that a first side of the organic light-emitting diode OLED in the blue subpixel SPB has a steeper slope than a second side, i.e., the opposite side. On the other hand, the surface of the second insulating layer SPC in the bottom display area BOT of the display panel 110 is sloped in such a way that the second side of the organic light-emitting diode OLED in the blue subpixel SPB has a steeper slope than the first side, i.e., the opposite side. The surface of the second insulating layer SPC in the top display area TOP of the display panel 110 is sloped in such a way that the first side of the organic light-emitting diode OLED in the green subpixel SPG has a steeper slope than the second side, i.e., the opposite side. On the other hand, the surface of the second insulating layer SPC in the bottom display area BOT of the display panel 110 is sloped in such a way that the second side of the organic light-emitting diode OLED in the green subpixel SPG has a steeper slope than the first side, i.e., the opposite side. The surface of the second insulating layer SPC in the top display area TOP of the display panel 110 is sloped in such a way that the first side of the organic light-emitting diode OLED in the red subpixel SPR has a steeper slope than the second side, i.e., the opposite side. On the other hand, the surface of the second insulating layer SPC in the bottom display area BOT of the display panel 110 is sloped in such a way that the second side of the organic light-emitting diode OLED in the red subpixel SPR has a steeper slope than the first side, i.e., the opposite side. The first and second sides of the organic light-emitting diode OLED may be defined to be on the long axis or short axis of the subpixels SPB, SPG, and SPR, for example.

In the second exemplary embodiment, it was learned that, by shifting a selected distance CF SHT the color filter layer CF in the top display area TOP and bottom display area BOT of the display panel 110, an image which is light, in the top display area TOP and bottom display area BOT of the display panel 110 could be focused to the middle display area MID. This is because the light path changes as the color filter layer CF in the top display area TOP and bottom display area BOT of the display panel 110 is shifted toward the middle display area MID.

Moreover, in the second exemplary embodiment, it was learned that, by forming the second insulating layer SPC with a sloping surface on the first insulating layer PLL to allow the organic light-emitting diode OLED to emit an image which is light, at a sloping angle, it is possible to improve or prevent problems like abrupt changes in the brightness and chromatic characteristics of the top display area TOP and bottom display area BOT of the display panel 110. This is because the optical axis of the organic light-emitting diode OLED in the top display area TOP and bottom display area BOT of the display panel 110 is shifted toward the shifted color filter layer CF and therefore there is little deviation in the optimal angle of light emission for the resonance structure (microcavity).

It was learned that the structure of the second exemplary embodiment, like the first exemplary embodiment, makes use of both the light emitted in a straight line from the organic light-emitting diode OLED and the light emitted at a certain angle—that is, from 0° to 20°.

As a consequence, in the second exemplary embodiment, the light path is not constrained by the shifted optical axis, unlike in the first exemplary embodiment. Hence, there is little decrease in brightness. Therefore, in the second exemplary embodiment, the lower part where the organic light-emitting diode OLED is located is sloped at a specific angle to correspond to the distance the color filter layer CF is moved, so as to keep the optical axis from deviating from the optimal angle for the resonance structure as much as possible.

As above, in the second exemplary embodiment, the light emitted from the intrinsic optical axis of organic light emitting diode may be directly used. Moreover, in the second exemplary embodiment, a slope is provided so as to make use of most of the resonance structure (microcavity) optimized for vertically-emitted light, and this leads to a change in the angle of light emission, thereby preventing changes in the brightness and chromatic characteristics of the display panel. As a result, in the second exemplary embodiment, there is no loss in the brightness of the display panel with the resonance structure, and the display panel is readily applicable to augmented reality devices which require high brightness and other devices.

Figure 21:
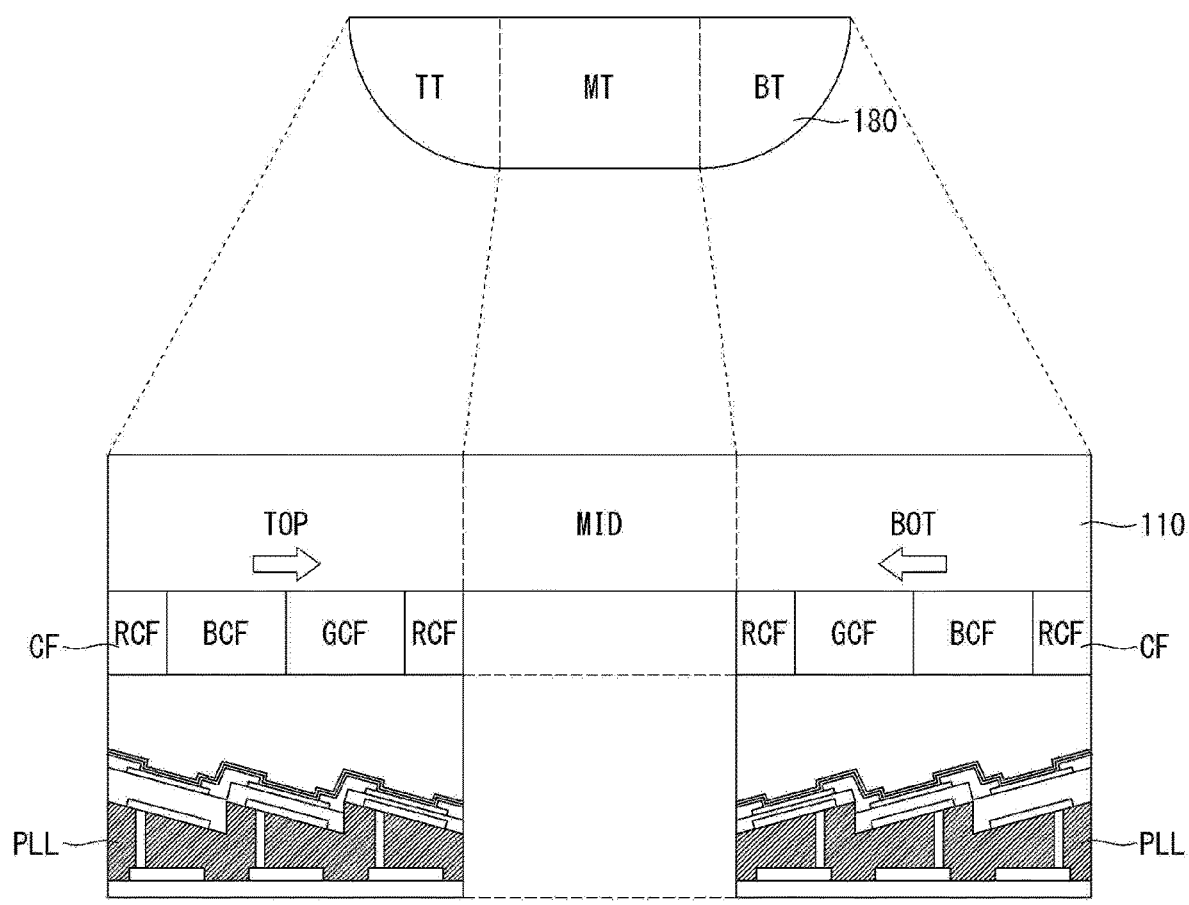
FIG. 21 is a view of a color filter layer and an insulating layer that are included in an optical lens and display panel made based on the first and second exemplary embodiments of the present disclosure.

FIG. 21 is a view of a color filter layer and an insulating layer that are included in an optical lens and display panel made based on the first and second exemplary embodiments of the present disclosure. However, to help clear understanding of parts of the display panel where substantial structural changes are made. FIG. 21 depicts the color filter layer and insulating layer in the top display area and the color filter layer and insulating layer in the bottom display area but not the color filter layer and insulating layer in the middle display area.

As shown in FIG. 21, the display panel 110 has a top display area TOP, a middle display area MID, and a bottom display area BOT. FIG. 21 shows the TOP on the left side and the bottom on the right side merely for convenience in the Figure, but the Figure can be oriented with the TOP at the upper side the BOT at the lower side. Also, the optical lens 180 has a top transmission area TT, a middle transmission area MT, and a bottom transmission area BT. Described below are changes that can be made, especially on the color filter layer CF and insulating layer PLL, to implement the first and second exemplary embodiments.

The color filter layer CF in the top display area TOP of the display panel 110 may be shifted to the right in the figure so as to be directed toward the middle display area MID. The surface of the insulating layer PLL in the top display area TOP of the display panel 110 may be sloped down to the right in the figure so as to be directed toward the middle display area MID, to correspond to the shift of the color filter layer CF.

The color filter layer CF in the bottom display area TOP of the display panel 110 may be shifted to the left in the figure so as to be directed toward the middle display area MID. The surface of the insulating layer PLL in the bottom display area BOT of the display panel 110 may be sloped down to the left in the figure so as to be directed toward the middle display area MID, to correspond to the shift of the color filter layer CF.

For ease of illustration in the various Figures, only one TOP pixel having three subpixels and only one BOT pixel having three subpixels is shown, but in the display panel 110, there will be a large number of top pixels and a large number of bottom pixels. The amount of the angle r that each particular pixel and subpixel is sloped will be based on its distance from the MID and it might vary from one pixel to another. The pixels farther from the MID may be tilted at a greater angle r to achieve a larger desired slope in some embodiments. The insulating layer that has the sloped upper surface, whether PLL, SPC or some other layer that creates the slope, will have a different slope for different relative positions of the pixel and the subpixel within each pixel in some embodiments.

As above, the present disclosure offers the advantage of preventing or improving problems like abrupt changes in the brightness and chromatic characteristics of the display panel, since most of the light emitted from the intrinsic optical axis of organic light emitting diode is used even if the optical lens is miniaturized. Another advantage of the present disclosure is that the optical axis can be shifted to prevent brightness loss when the display panel with a resonance structure is applied to specific devices. A still another advantage of the present disclosure is to provide a self-emissive display device that is suitable for miniaturizing the optical lens when making an eyeglasses-like augmented reality device.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a display panel having a lower substrate, an upper substrate and a display area;
an insulating layer that lies over the lower substrate
a first sloped upper surface of the insulating layer positioned in a first location in the display area;
a second sloped upper surface of the insulating layer positioned in a second location in the display area, the second slope having a different angle than the first slope;
a plurality of organic light-emitting diodes on the insulating layer at the first and second locations; and
a dielectric layer located between the insulating layer and the organic light-emitting diodes, the dielectric layer having a first height at the first location and a second height at the second location.

2. The display device of claim 1, wherein the organic light-emitting diodes have a slope corresponding to the sloped surface of the insulating layer on which they are located.

3. The display device of claim 1, wherein the dielectric layer has a slope corresponding to the sloped surface of the insulating layer at the location on which it is positioned.

4. A display device comprising:
a display panel having a lower substrate, an upper substrate, and a plurality of subpixels located between the lower and upper substrates; and
a color filter layer overlying the upper substrate, the color filter layer having a plurality of color filters and each color filter is positioned to aligned with a part of a first subpixel and part of a second subpixel,
wherein the display panel comprises:
an insulating layer on the lower substrate, the insulating layer having a sloped surface at selected locations in a display area of the display panel;
organic light-emitting diodes that lie on the insulating layer and are positioned to correspond to the plurality of subpixels;
a dielectric layer located between the insulating layer and the organic light-emitting diodes, the dielectric layer having a first height at a first location and a second height at a second location.

5. The display device of claim 4, wherein the surface of the insulating layer is flat in a middle display area of the display panel and sloped toward the middle display area in respective top and bottom display areas relative to the middle display area of the display panel.

6. The display device of claim 4, wherein the insulating layer comprises:
a first insulating layer that lies over the lower substrate and has a flat surface; and
a second insulating layer that lies over the first insulating layer, the second insulating layer having the sloped surface.

7. The display device of claim 4, further comprising a reflective layer located between the insulating layer and the organic light-emitting diodes,
   wherein the reflective layer has a slope corresponding to the sloped surface of the insulating layer at the location on which it is positioned.

8. An augmented reality viewing device comprising:
   a display panel that displays an image;
   an optical lens that is positioned on the front of the display panel; and
   a housing that contains the display panel and the optical lens,
   wherein the display panel comprises:
   a lower substrate;
   an upper substrate;
   a plurality of subpixels located between the lower and upper substrates;
   an insulating layer on the lower substrate, the insulating layer having a sloped surface at selected locations in the display area;
   a plurality of organic light-emitting diodes that lie on the insulating layer and are positioned to correspond to the respective plurality of subpixels; and
   a dielectric layer located between the insulating layer and the organic light-emitting diodes, the dielectric layer having a first height at a first location and a second height at a second location.

9. The augmented reality viewing device of claim 8, wherein the insulating layer has a flat surface in a middle display area of the display panel, and has the sloped surface in a top display area and a bottom display area relative to the middle display area of the display panel, the sloped of the surface being directed toward the middle display area.

10. The augmented reality viewing device of claim 9, further including:
   a color filter layer positioned in at least one of the top display area, the bottom display area, and the middle display area, the relative location of the color filter being different in the top display area than in the middle display area.

11. The augmented reality viewing device of claim 10, wherein the color filter layer in the top display area is shifted to have a light path toward the middle display area.

12. The augmented reality viewing device of claim 8, wherein the insulating layer comprises:
   a first insulating layer that lies over the lower substrate and has a flat surface; and
   a second insulating layer that lies over the first insulating layer and has the sloped surface.

13. The augmented reality viewing device of claim 8, wherein the display panel has an optical axis that runs straight in a middle display area and is sloped toward the middle display area in top and bottom display areas.

14. A display device comprising:
   a display panel having a lower substrate, an upper substrate, and a plurality of subpixels located between the lower and upper substrates;
   pixel positioned overlying the lower substrate, the pixel having a red subpixel, a green subpixel and a blue subpixel, each of which emit light;
   organic light-emitting diodes that lie on a first insulating layer and positioned to correspond to the each of the respective subpixels; and
   a color filter layer overlying the upper substrate, the color filter layer having a red color filter, a green color filter and a blue color filter, wherein each of the color filters is positioned to align with part of the respective red, green and blue subpixel that is of the same color as the filter and to align with part of the subpixel that is adjacent to the subpixel that is a different color.

15. The display device of claim 14 wherein the first insulating layer has a sloped surface at selected locations.

16. The display device of claim 15 wherein the angle of the sloped varies based on the relative location of the pixel with respect to a middle region of the display panel.

17. The display device of claim 14 further including a second insulating layer overlying the first insulating layer sloped each of the subpixels, the second insulating layer being positioned between an anode of the OLED and a transistor driving the OLED.

18. The display device of claim 17 wherein the second insulating layer has first thickness for a first subpixel within the pixel and a second, different thickness for a second subpixel with the pixel and a third, different thickness for a third subpixel within the pixel.

* * * * *